US010283517B2

(12) United States Patent
Ohashi et al.

(10) Patent No.: US 10,283,517 B2
(45) Date of Patent: May 7, 2019

(54) SEMICONDUCTOR MEMORY DEVICE AND METHOD OF MANUFACTURING THE SAME

(71) Applicant: Toshiba Memory Corporation, Minato-ku (JP)

(72) Inventors: Takuo Ohashi, Kuwana (JP); Fumiki Aiso, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/703,006

(22) Filed: Sep. 13, 2017

(65) Prior Publication Data

US 2018/0006053 A1 Jan. 4, 2018

Related U.S. Application Data

(62) Division of application No. 15/071,497, filed on Mar. 16, 2016, now Pat. No. 9,793,290.

(60) Provisional application No. 62/193,439, filed on Jul. 16, 2015.

(51) Int. Cl.

| | |
|---|---|
| ***H01L 27/11578*** | (2017.01) |
| ***H01L 27/11582*** | (2017.01) |
| ***H01L 27/11563*** | (2017.01) |
| ***H01L 27/1157*** | (2017.01) |
| ***H01L 27/11514*** | (2017.01) |
| ***H01L 27/11551*** | (2017.01) |

(Continued)

(52) U.S. Cl.

CPC .... *H01L 27/11578* (2013.01); *H01L 27/1157* (2013.01); *H01L 27/11514* (2013.01); *H01L 27/11524* (2013.01); *H01L 27/11551* (2013.01); *H01L 27/11563* (2013.01); *H01L 27/11582* (2013.01); *H01L 27/11556* (2013.01); *H01L 2924/1438* (2013.01)

(58) Field of Classification Search

CPC ......... H01L 27/11582; H01L 27/11556; H01L 27/11551; H01L 27/11578; H01L 27/11514; H01L 2924/1438; H01L 27/11524; H01L 27/11563; H01L 27/1157; H01L 29/66833; H01L 29/792

See application file for complete search history.

(56) References Cited

U.S. PATENT DOCUMENTS

2011/0233648 A1* 9/2011 Seol .................. H01L 21/32137 257/324
2011/0291178 A1* 12/2011 Sasaki ............... H01L 27/11578 257/324

(Continued)

*Primary Examiner* — Feifei Yeung Lopez
(74) *Attorney, Agent, or Firm* — Oblon, McClelland, Maier & Neustadt, L.L.P.

(57) ABSTRACT

According to an embodiment, a semiconductor memory device includes a plurality of control gate electrodes, a semiconductor layer, and a charge accumulation layer. The plurality of control gate electrodes are provided as a stack above a substrate. The semiconductor layer has as its longitudinal direction a direction perpendicular to the substrate, and faces the plurality of control gate electrodes. The charge accumulation layer is positioned between the control gate electrode and the semiconductor layer. A lower end of the charge accumulation layer is positioned more upwardly than a lower end of a lowermost layer-positioned one of the control gate electrodes.

12 Claims, 32 Drawing Sheets

(51) Int. Cl.
*H01L 27/11524* (2017.01)
*H01L 27/11556* (2017.01)

(56) References Cited

U.S. PATENT DOCUMENTS

| | | | |
|---|---|---|---|
| 2013/0134492 | A1 | 5/2013 | Yang et al. |
| 2015/0311214 | A1 | 10/2015 | Yoo et al. |

* cited by examiner

9
HOST
External Control Signal
External I/O
Internal Control Signal
7
State Machine
6
Command I/F
4
Data Input/ Output Buffer
5
Address Register
1
Memory Cell Array
MB
MB
MB
MB
2
Column Control Circuit
3
Row Control Circuit
10
Voltage Generating Circuit 1(MF)
110
102a
109
111
106(BL)
107(SL)
108(LI)
STD
MC
STS
STSb
105(122)
Z
Y
X
102(SGD)
102(WL)
102(SGS)
102(SGSb)
101 op1
op1
SBA
Z
Y
134A
103A
122A
124
141A
123
141A
103A
141A
103A
141A
133A
132A
113A
103A
141A
103A
141A
131A
112A
101

SEMICONDUCTOR MEMORY DEVICE AND METHOD OF MANUFACTURING THE SAME

CROSS REFERENCE TO RELATED APPLICATIONS

The present application is a divisional application of application Ser. No. 15/071,497, filed on Mar. 16, 2016, currently pending, which is based on and claims the benefit of priority from prior U.S. Provisional Patent Application No. 62/193,439, filed on Jul. 16, 2015, the entire contents of both of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment comprises a plurality of control gate electrodes, a semiconductor layer, and a charge accumulation layer. The plurality of control gate electrodes are provided as a stack above a substrate. The semiconductor layer has as its longitudinal direction a direction perpendicular to the substrate, and faces the plurality of control gate electrodes. The charge accumulation layer is positioned between the control gate electrode and the semiconductor layer. A lower end of the charge accumulation layer is positioned more upwardly than a lower end of a lowermost layer-positioned one of the control gate electrodes.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below have a structure in which a memory string extends linearly in a perpendicular direction to a substrate, but a similar structure may be applied also to a U-shaped structure in which the memory string is doubled back on an opposite side midway. Moreover, each of the drawings of the nonvolatile semiconductor memory devices employed in the embodiments below is schematic, and thicknesses, widths, ratios, and so on, of layers are different from those of the actual nonvolatile semiconductor memory devices.

In addition, the nonvolatile semiconductor memory devices described below relate to nonvolatile semiconductor memory devices having a structure in which a plurality of MONOS (Metal-Oxide-Nitride-Oxide-Semiconductor) type memory cells (memory transistors) are provided in a height direction, each of the MONOS type memory cells including: a semiconductor layer acting as a channel provided in a column shape perpendicularly to a substrate; and a control gate electrode layer made of metal provided on a side surface of the semiconductor layer via a charge accumulation layer. However, this is also not intended to limit the present invention, and the present invention may be applied also to another form of charge accumulation layer, for example, a structure including a SONOS (Semiconductor-Oxide-Nitride-Oxide-Semiconductor) type memory cell that includes a control gate electrode made of a semiconductor, or a structure including a floating gate type memory cell.

[Semiconductor Memory Device According to First Embodiment]

Figure 1:
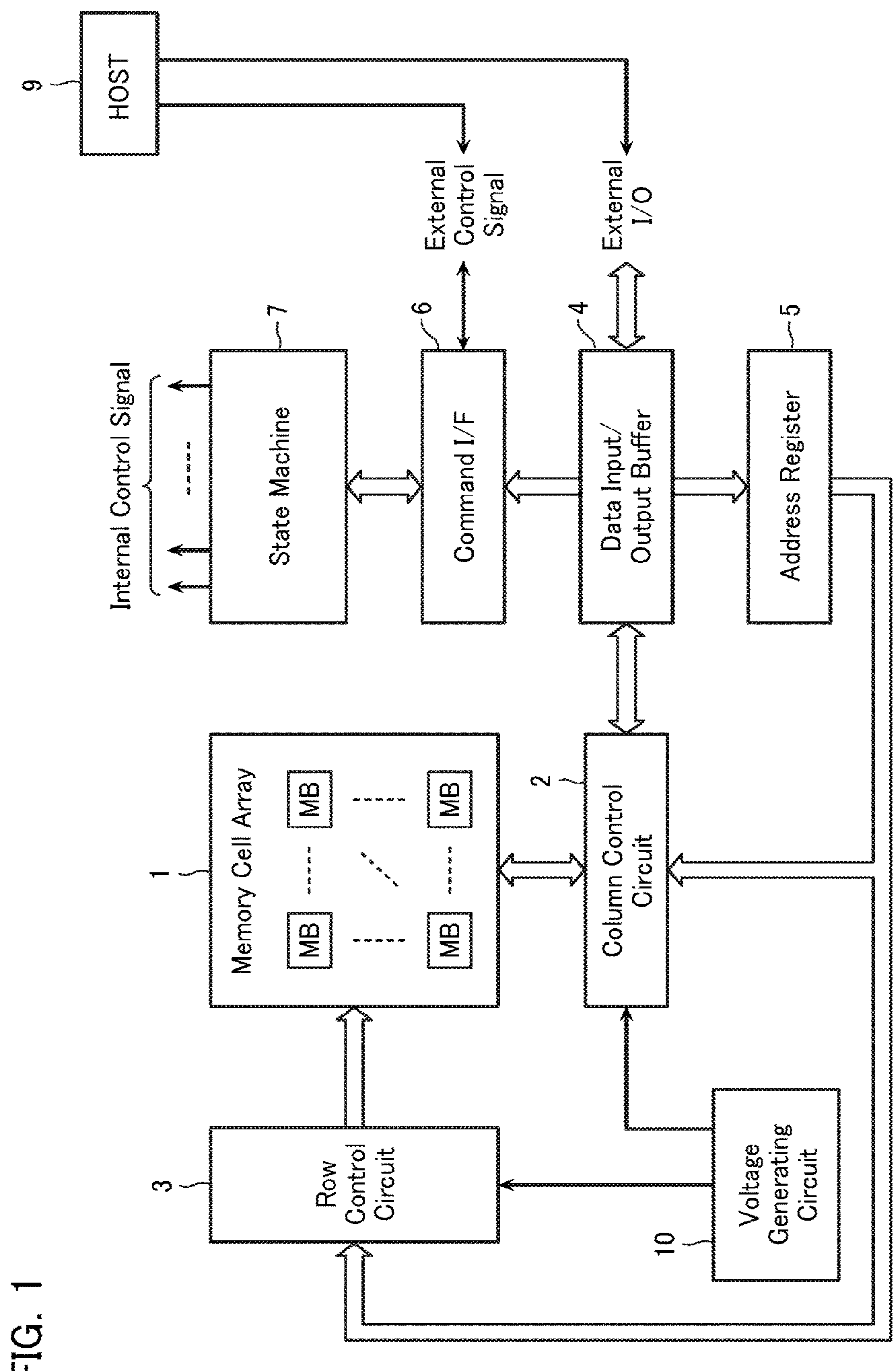
FIG. 1 is a block diagram of a nonvolatile semiconductor memory device according to a first embodiment.

FIG. 1 is a block diagram of a nonvolatile semiconductor memory device according to a first embodiment. The nonvolatile semiconductor memory device stores user data inputted from an external host 9, in a certain address in a memory cell array 1. In addition, the nonvolatile semiconductor memory device reads user data from a certain address in the memory cell array 1, and outputs the user data to the external host 9.

That is, as shown in FIG. 1, the nonvolatile semiconductor memory device includes the memory cell array 1 that stores user data. The memory cell array 1 includes a plurality of memory blocks MB. As will be described later with reference to FIG. 2, these memory blocks MB each include: a plurality of memory cells MC; and a bit line BL and a word line WL connected to these memory cells MC.

As shown in FIG. 1, the nonvolatile semiconductor memory device includes a column control circuit 2 provided in a periphery of the memory cell array 1. When performing write of user data, the column control circuit 2 transfers a voltage generated by a voltage generating circuit 10 to a desired bit line BL, according to the inputted user data. Moreover, the column control circuit 2 includes an unillustrated sense amplifier, and when performing read of user data, detects a voltage or potential of a certain bit line BL.

As shown in FIG. 1, the nonvolatile semiconductor memory device includes a row control circuit 3 provided in a periphery of the memory cell array 1. The row control circuit 3 transfers a voltage generated by the voltage generating circuit 10 to a desired word line WL, and so on, according to inputted address data.

As shown in FIG. 1, the nonvolatile semiconductor memory device includes an address register 5 that supplies address data to the column control circuit 2 and the row control circuit 3. The address register 5 stores address data inputted from a data input/output buffer 4.

As shown in FIG. 1, the nonvolatile semiconductor memory device includes the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the nonvolatile semiconductor memory device includes the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the nonvolatile semiconductor memory device includes the data input/output buffer 4 which is connected to the external host 9 via an I/O line. The data input/output buffer 4 receives write data from the external host 9, and transfers the write data to the column control circuit 2. Moreover, the data input/output buffer 4 receives command data from the external host 9, and transfers the command data to the command interface 6. In addition, the data input/output buffer 4 receives address data from the external host 9, and transfers the address data to the address register 5. Furthermore, the data input/output buffer 4 receives read data from the column control circuit 2, and transfers the read data to the external host 9.

As shown in FIG. 1, the nonvolatile semiconductor memory device includes the command interface 6 that receives an external control signal from the external host 9. The command interface 6 determines which of user data, command data, and address data inputted to the data input/output buffer 4 is, based on the external control signal inputted from the external host 9, and controls the data input/output buffer 4. In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Figure 2:
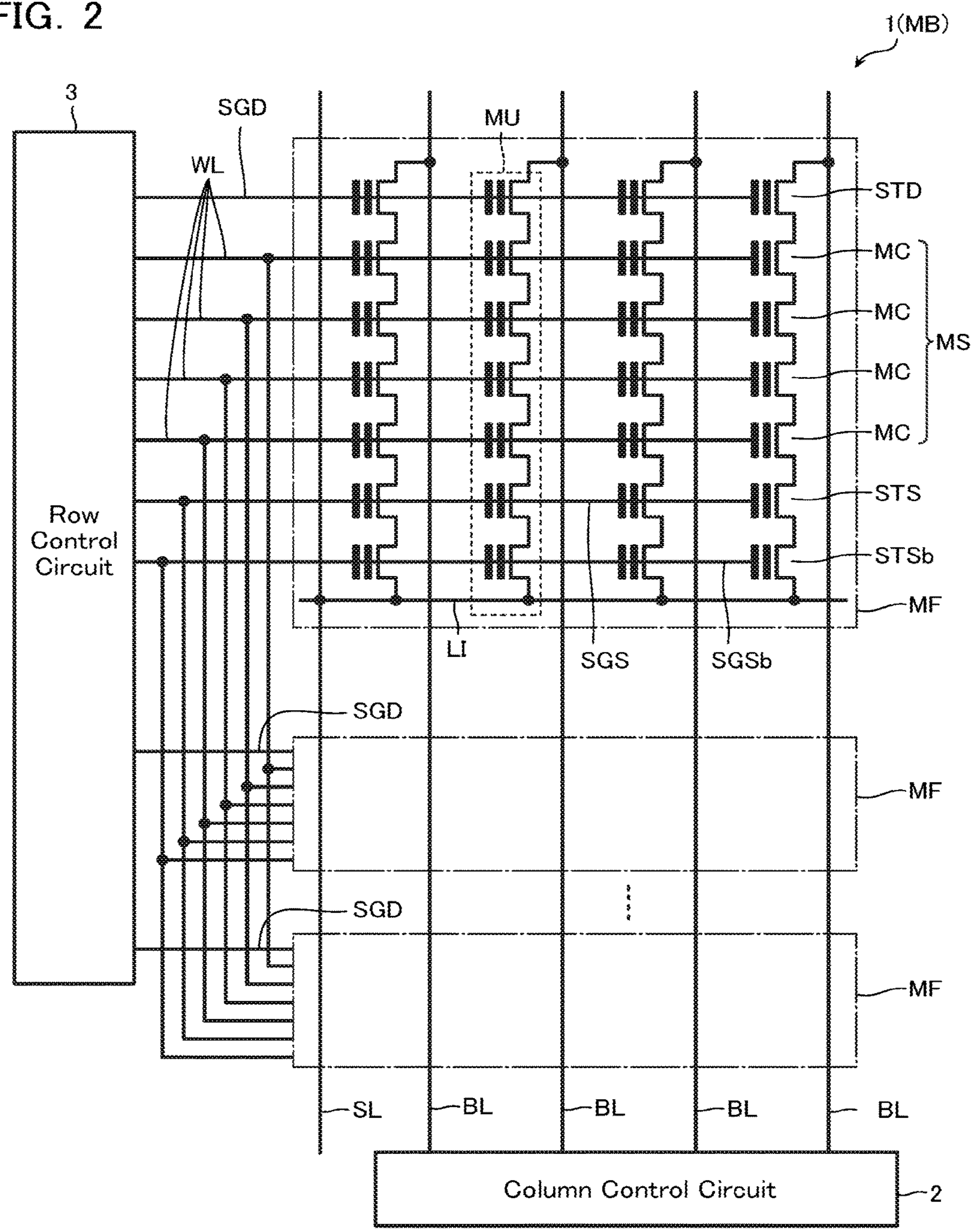
FIG. 2 is a circuit diagram showing a configuration of part of the nonvolatile semiconductor memory device.

Next, a circuit configuration of part of the memory cell array 1 according to the present embodiment will be described with reference to FIG. 2. FIG. 2 is an equivalent circuit diagram showing a configuration of the memory block MB configuring the memory cell array 1.

As shown in FIG. 2, the memory block MB includes a plurality of the memory cells MC. The memory cells MC each store a one-bit portion or a multiple-bit portion of data configuring the above-mentioned user data. Moreover, in the memory block MB shown in FIG. 2, a certain drain side select gate line SGD and a certain word line WL are selected by the row control circuit 3, whereby a certain number of the memory cells MC are selected. These selected memory cells MC each have a bit line BL connected thereto, and a current or voltage of these bit lines BL attains a different magnitude according to data recorded in the memory cell MC. The column control circuit 2 determines data recorded in the plurality of memory cells MC by detecting the current or voltage of this bit line BL, and outputs this data as user data.

As shown in FIG. 2, the memory blocks MB each include a plurality of memory fingers MF. Commonly connected to these plurality of memory fingers MF are a plurality of the bit lines BL and a source line SL. Each of the memory fingers MF is connected to the column control circuit 2 via the bit lines BL, and is connected to an unillustrated source line driver via the source line SL.

The memory finger MF includes a plurality of memory units MU that have their one ends connected to the bit lines BL and have their other ends connected to the source line SL via a source contact LI. The memory units MU included in one memory finger MF are all connected to different bit lines BL.

As shown in FIG. 2, the memory unit MU includes a plurality of the memory cells MC connected in series. As will be mentioned later, the memory cell MC includes: a semiconductor layer functioning as a channel; a charge accumulation layer; and a control gate electrode. Moreover, the memory cell MC accumulates a charge in the charge accumulation layer based on a voltage applied to the control gate electrode, and changes a control gate voltage (threshold voltage) for rendering the channel in a conductive state. Hereafter, the plurality of memory cells MC connected in series will be called a "memory string MS". The row control circuit 3 transfers a voltage to a certain word line WL, thereby transferring this voltage to the control gate electrode of a certain memory cell MC in the memory string MS.

As shown in FIG. 2, commonly connected to the control gate electrodes of pluralities of the memory cells MC configuring different memory strings MS are, respectively, the word lines WL. These pluralities of memory cells MC are connected to the row control circuit 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU includes a drain side select gate transistor STD connected between the memory string MS and the bit line BL. Connected to a control gate of the drain side select gate transistor STD is the drain side select gate line SGD. The drain side select gate line SGD is connected to the row control circuit 3, and selectively connects the memory string MS and the bit line BL based on an inputted signal. Moreover, in the example shown in FIG. 2, the drain side select gate line SGD is provided independently to each of the memory fingers MF, and is commonly connected to the control gates of all of the drain side select gate transistors STD in the memory finger MF. The row control circuit 3 selects a certain drain side select gate line SGD, thereby selectively connecting all of the memory strings MS in a certain memory finger MF to the bit lines BL.

Moreover, as shown in FIG. 2, the memory unit MU includes a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row control circuit 3 connects all of the memory strings MS in the memory block MB to the source line SL, based on an inputted signal.

Figure 3:
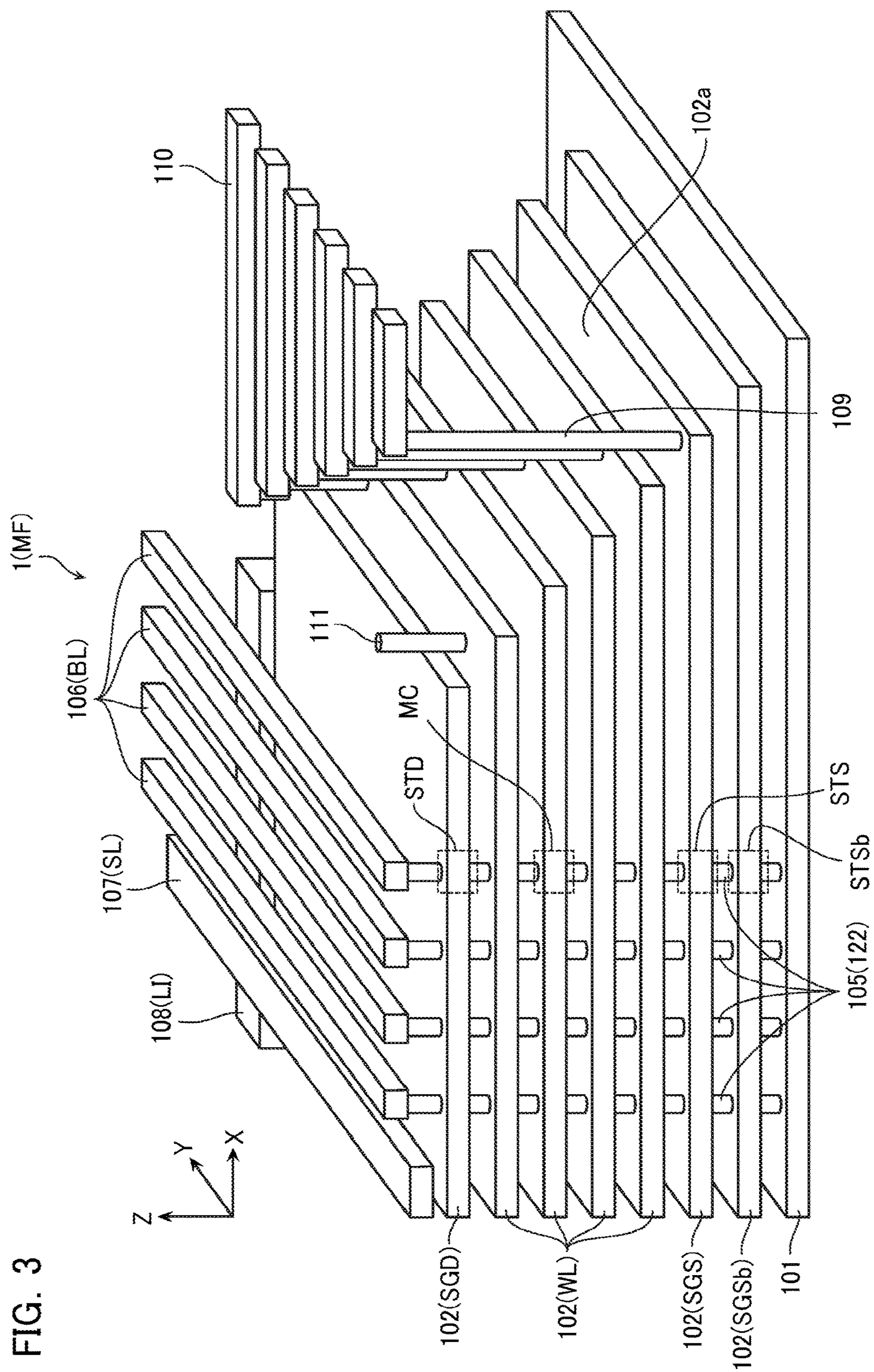
FIG. 3 is a perspective view showing a configuration of part of the nonvolatile semiconductor memory device.

Next, a schematic configuration of the memory cell array 1 will be described with reference to FIG. 3. FIG. 3 is a schematic perspective view showing a configuration of part of the memory finger MF. Note that in FIG. 3, part of the configuration is omitted. Moreover, the configuration shown in FIG. 3 is merely an example, and a specific configuration may be appropriately changed.

As shown in FIG. 3, the memory finger MF includes: a substrate 101; and a plurality of conductive layers 102 stacked in a Z direction on the substrate 101. In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a conductive layer of the likes of tungsten (W) or polysilicon, for example, and functions as each of the word line WL and control gate electrode of the memory cell MC, the source side select gate line SGS and control gate electrode of the source side select gate transistor STS, the drain side select gate line SGD and control gate electrode of the drain side select gate transistor STD, or the lowermost layer source side select gate line SGSb and control gate electrode of the lowermost layer source side select gate transistor STSb.

As shown in FIG. 3, the plurality of conductive layers 102 are formed in steps, at their ends in an X direction. That is, the conductive layer 102 includes a contact portion **102*a* that does not face a lower surface of the conductive layer 102 positioned in a layer above it. Moreover, the conductive layer 102 is connected to a via contact wiring line 109 at this contact portion 102*a*. Moreover, a wiring line 110 is provided at an upper end of the via contact wiring line 109. Note that the via contact wiring line 109 and the wiring line 110** are configured from a conductive layer of the likes of tungsten.

In addition, as shown in FIG. 3, the memory finger MF includes a support 111. The support 111 communicates with holes provided in the plurality of conductive layers 102. The support 111 supports a posture of an unillustrated insulating layer provided between the conductive layers 102, in a manufacturing step.

In addition, as shown in FIG. 3, the memory finger MF includes a conductive layer 108. The conductive layer 108 faces side surfaces in a Y direction of the plurality of conductive layers 102, and has a plate-like shape extending in the X direction and the Z direction. Moreover, a lower end of the conductive layer 108 contacts the substrate 101. The conductive layer 108 is configured from a conductive layer of the likes of tungsten (W), for example, and functions as the source contact LI.

In addition, as shown in FIG. 3, the memory finger MF includes a plurality of conductive layers 106 and a conductive layer 107 that are positioned upwardly of the plurality of conductive layers 102 and memory columnar bodies 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Figure 4:
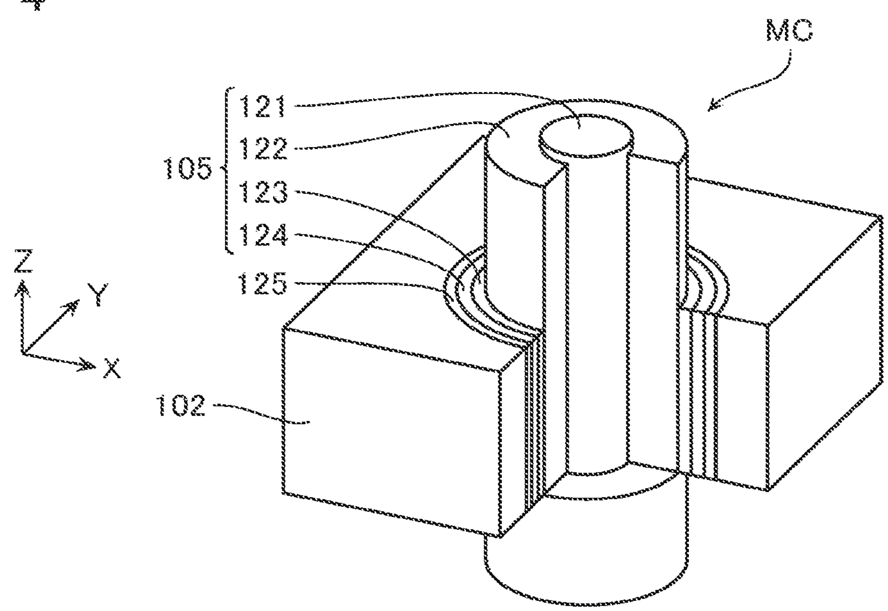
FIG. 4 is a perspective view showing a configuration of part of the nonvolatile semiconductor memory device.

Next, a schematic configuration of the memory cell MC will be described with reference to FIG. 4. FIG. 4 is a schematic perspective view showing the configuration of the memory cell MC. Note that in FIG. 4, part of the configuration is omitted. As shown in FIG. 4, the memory cell MC is provided at an intersection of the conductive layer 102 and the memory columnar body 105. The memory columnar body 105 includes: a core insulating layer 121; and a semiconductor layer 122, a tunnel insulating layer 123, and a charge accumulation layer 124 that are stacked on a sidewall of the core insulating layer 121. Furthermore, a block insulating layer 125 is provided between the memory columnar body 105 and the conductive layer 102.

The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC, the lowermost layer source side select gate transistor STSb, the source side select gate transistor STS, and the drain side select gate transistor STD. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride (SiN), for example. The block insulating layer 125 is configured from an insulating layer of the likes of silicon oxide ($SiO_2$), for example.

Figure 5:
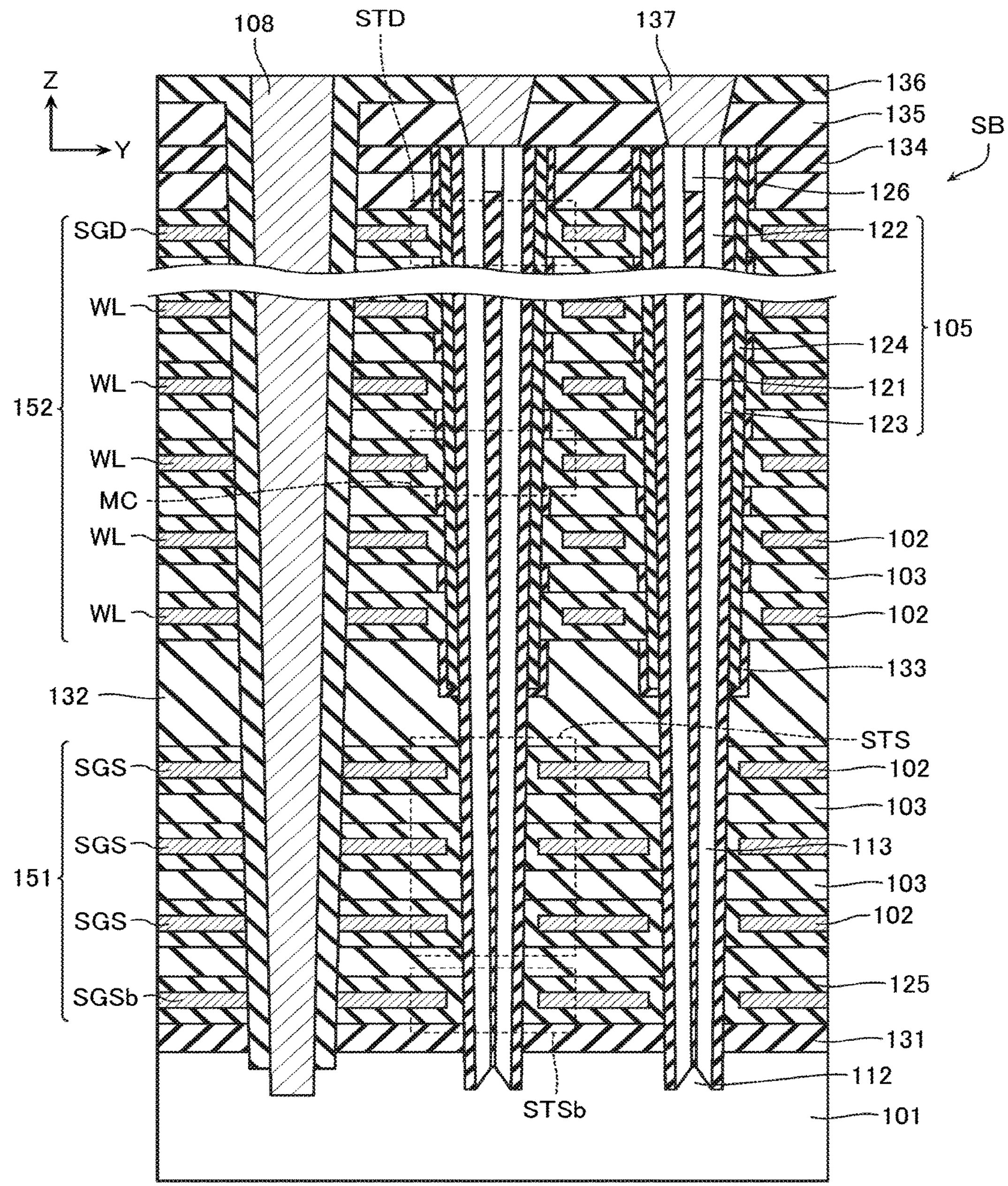
FIG. 5 is a cross-sectional view showing a configuration of part of the nonvolatile semiconductor memory device.

Next, the nonvolatile semiconductor memory device according to the present embodiment will be described in more detail with reference to FIG. 5. FIG. 5 is a cross-sectional view showing a configuration of part of the nonvolatile semiconductor memory device.

As shown in FIG. 5, the nonvolatile semiconductor memory device according to the present embodiment includes: the substrate 101; a stacked body SB including a plurality of the conductive layers 102 and inter-layer insulating layers 103 provided on the substrate 101; the memory columnar body 105 extending in the Z direction; and the conductive layer 108 functioning as the source contact LI. The memory columnar body 105 is connected to the bit line BL via a bit line contact 137, and is connected to the source line SL via the substrate 101 and the conductive layer 108.

First, the stacked body SB will be described with reference to FIG. 5. As shown in FIG. 5, the stacked body SB includes: a first stacked portion 151 provided on the substrate 101; and a second stacked portion 152 provided upwardly of the first stacked portion 151 via an inter-layer insulating layer 132. The first stacked portion 151 functions as part of the lowermost layer source side select gate transistor STSb and the source side select gate transistor STS. The second stacked portion 152 functions as part of the memory cell MC and the drain side select gate transistor STD.

As shown in FIG. 5, the first stacked portion 151 and the second stacked portion 152 each include a plurality of the conductive layers 102 and inter-layer insulating layers 103 provided above the substrate. In addition, an upper surface, lower surface, and side surface of the conductive layer 102 are covered by the block insulating layer 125. The conductive layer 102 is formed from a conductive material of the likes of tungsten (W), for example. Moreover, the inter-layer insulating layer 103 and the block insulating layer 125 are formed from an insulating material of the likes of silicon oxide ($SiO_2$), for example.

Now, as shown in FIG. 5, in the present embodiment, the inter-layer insulating layer 132 is provided between the first stacked portion 151 and the second stacked portion 152. As shown in FIG. 5, a film thickness of the inter-layer insulating layer 132 is larger than a film thickness of the inter-layer insulating layer 103.

Next, the memory columnar body 105 will be described with reference to FIG. 5. As shown in FIG. 5, the memory columnar body 105 includes: the core insulating layer 121 extending in the Z direction; and the semiconductor layer 122, the tunnel insulating layer 123, and the charge accumulation layer 124 that are stacked on the sidewall of the core insulating layer 121. The core insulating layer 121 is configured from an insulating layer of the likes of silicon oxide ($SiO_2$), for example. The semiconductor layer 122 is configured from a semiconductor layer of the likes of polysilicon, for example, and functions as the channel of the memory cell MC, and so on. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride (SiN), for example.

As shown in FIG. 5, the core insulating layer 121, the semiconductor layer 122, the tunnel insulating layer 123, and the charge accumulation layer 124 have a columnar shape extending in the Z direction. Moreover, upper ends of the core insulating layer 121, the semiconductor layer 122, the tunnel insulating layer 123, and the charge accumulation layer 124 are positioned more upwardly than the upper surface of the conductive layer 102.

Now, as shown in FIG. 5, in the nonvolatile semiconductor memory device according to the present embodiment, lower ends of the core insulating layer 121, the semiconductor layer 122, and the tunnel insulating layer 123 are positioned more downwardly than an upper surface of the substrate 101. In contrast, in the nonvolatile semiconductor memory device according to the present embodiment, a lower end of the charge accumulation layer 124 is positioned between the first stacked portion 151 and the second stacked portion 152.

In addition, as shown in FIG. 5, in the present embodiment, it is configured that in the second stacked portion 152, the charge accumulation layer 124 is provided between the conductive layer 102 and the semiconductor layer 122, and the memory cell MC, and so on, include the charge accumulation layer 124. On the other hand, in the present embodiment, it is configured that in the first stacked portion 151, the charge accumulation layer 124 is not provided between the conductive layer 102 and the semiconductor layer 122, and the source side select gate transistor STS, and so on, do not include the charge accumulation layer 124.

In addition, as shown in FIG. 5, in the nonvolatile semiconductor memory device according to the present embodiment, a first portion 112 positioned at the lower end of the semiconductor layer 122 is formed integrally with the substrate 101. That is, the first portion 112 of the semiconductor layer 122 is a monocrystalline part of a semiconductor such as silicon (Si) configuring the substrate 101. Note that a remaining portion of the semiconductor layer 122 (hereafter, called "second portion 113") is configured from a semiconductor such as silicon (polysilicon) having a polycrystalline structure. The second portion 113 is connected to the first portion 112 at a lower end of the second portion 113.

In addition, as shown in FIG. 5, part of the memory columnar body 105 is covered by a cover insulating layer 133. The cover insulating layer 133 covers a lower surface and part of a sidewall of the charge accumulation layer 124. Moreover, a lower end of the cover insulating layer 133 is positioned between the first stacked portion 151 and the second stacked portion 152.

[Semiconductor Memory Device According to Comparative Example]

Figure 6:
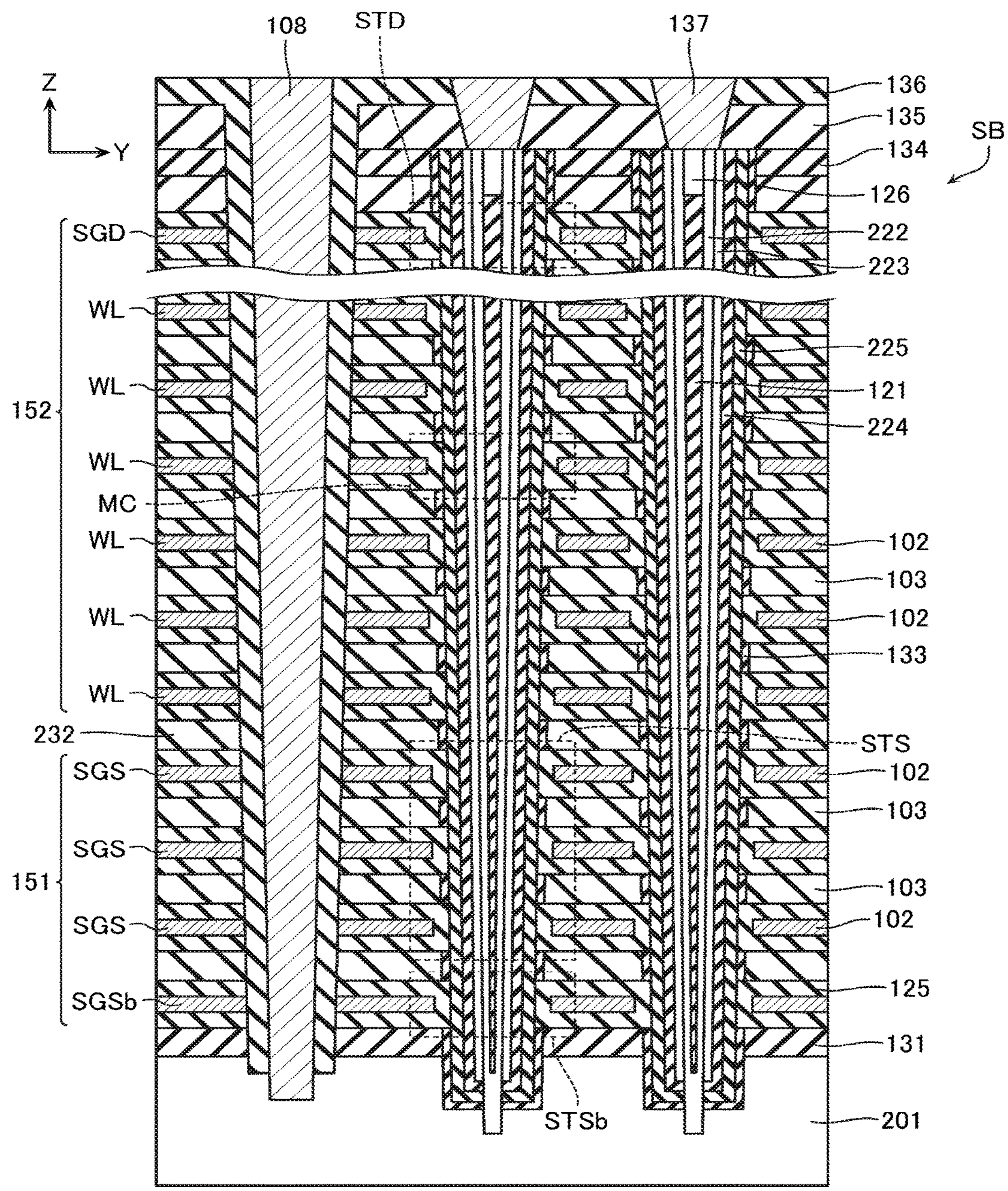
FIG. 6 is a cross-sectional view showing a configuration of part of a nonvolatile semiconductor memory device according to a comparative example.

Next, a configuration of a nonvolatile semiconductor memory device according to a comparative example will be described with reference to FIG. 6. FIG. 6 is a cross-sectional view showing a configuration of part of the nonvolatile semiconductor memory device. Note that in the description below, portions similar to those of the nonvolatile semiconductor memory device according to the first embodiment are assigned with identical reference symbols to those assigned in the first embodiment, and descriptions thereof will be omitted.

As shown in FIG. 6, the nonvolatile semiconductor memory device according to the comparative example is basically configured similarly to the nonvolatile semiconductor memory device according to the first embodiment, but differs from the nonvolatile semiconductor memory device according to the first embodiment in the following points.

That is, as shown in FIG. 6, a charge accumulation layer 225 according to the comparative example is basically formed similarly to the charge accumulation layer 124 according to the first embodiment, but a lower end of the charge accumulation layer 225 is positioned on the inside of a substrate 201. Therefore, in the comparative example, the memory cell MC, the lowermost layer source side select gate transistor STSb, and the source side select gate transistor STS all include the charge accumulation layer 225.

In addition, as shown in FIG. 6, in the comparative example, a first semiconductor layer 222 and a second semiconductor layer 223 are stacked on the sidewall of the core insulating layer 121, and these first semiconductor layer 222 and second semiconductor layer 223 are configured as the channel of the memory cell MC, and so on. These first semiconductor layer 222 and second semiconductor layer 223 are both configured from a semiconductor such as silicon (polysilicon) having a polycrystalline structure.

Moreover, as shown in FIG. 6, in the nonvolatile semiconductor memory device according to the comparative example, a film thickness of an inter-layer insulating layer 232 positioned between the first stacked portion 151 and the second stacked portion 152 of the stacked body SB is equal to a film thickness of the inter-layer insulating layer 103 positioned between a plurality of the conductive layers 102.

[Comparison of Semiconductor Devices]

Next, the nonvolatile semiconductor memory device according to the first embodiment and the nonvolatile semiconductor memory device according to the comparative example will be compared with reference to FIGS. 5 and 6.

As described with reference to FIG. 6, in the nonvolatile semiconductor memory device according to the comparative example, the charge accumulation layer 225 is provided on the inside of the substrate 201. Now, sometimes, when a charge got accumulated in a portion provided on the inside of the substrate 201, of the charge accumulation layer 225, a threshold voltage for rendering the substrate 201 in a conductive state during a read operation, and so on, ended up increasing and the first semiconductor layer 222 and second semiconductor layer 223 operating as the channel of the memory cell MC, and so on, got electrically divided from the conductive layer 108 operating as the source contact LI.

In contrast, in the nonvolatile semiconductor memory device according to the first embodiment, as described with reference to FIG. 5, the lower end of the charge accumulation layer 124 is positioned between the first stacked portion 151 and the second stacked portion 152, and the charge accumulation layer 124 is not provided on the inside of the substrate 101. Therefore, the semiconductor layer 122 operating as the channel of the memory cell MC, and so on, can be prevented from getting electrically divided from the conductive layer 108 operating as the source contact LI. This makes it possible to manufacture a nonvolatile semiconductor memory device that operates suitably.

In addition, as described with reference to FIG. 6, in the nonvolatile semiconductor memory device according to the comparative example, the memory cell MC, the lowermost layer source side select gate transistor STSb, and the source side select gate transistor STS all include the charge accumulation layer 225. Therefore, sometimes, while continuing a read operation or a write operation, and so on, a charge accumulated in the charge accumulation layer 225 of the lowermost layer source side select gate transistor STSb and the source side select gate transistor STS, and a threshold voltage of the lowermost layer source side select gate transistor STSb and the source side select gate transistor STS ended up fluctuating.

In contrast, in the nonvolatile semiconductor memory device according to the first embodiment, as described with reference to FIG. 5, the lowermost layer source side select gate transistor STSb and the source side select gate transistor STS do not include the charge accumulation layer. Therefore, fluctuation in a threshold voltage of the lowermost layer source side select gate transistor STSb and the source side select gate transistor STS can be prevented.

Moreover, as described with reference to FIG. 6, in the nonvolatile semiconductor memory device according to the comparative example, the first semiconductor layer 222 and the second semiconductor layer 223 stacked on the sidewall of the core insulating layer 121 are used as the channel of the memory cell MC, and so on. In such a mode, sometimes, an electrical resistance ended up occurring at a contact interface between the substrate 201 and the first semiconductor layer 222, and a current flowing in the bit line BL ended up decreasing.

In contrast, in the nonvolatile semiconductor memory device according to the first embodiment, as described with reference to FIG. 5, the first portion 112 positioned at the lower end of the semiconductor layer 122 is formed integrally with the substrate 101. Therefore, an electrical resistance at a contact interface between the first portion 112 of the semiconductor layer 122 and the substrate 101, does not occur.

[Method of Manufacturing]

Figure 7:
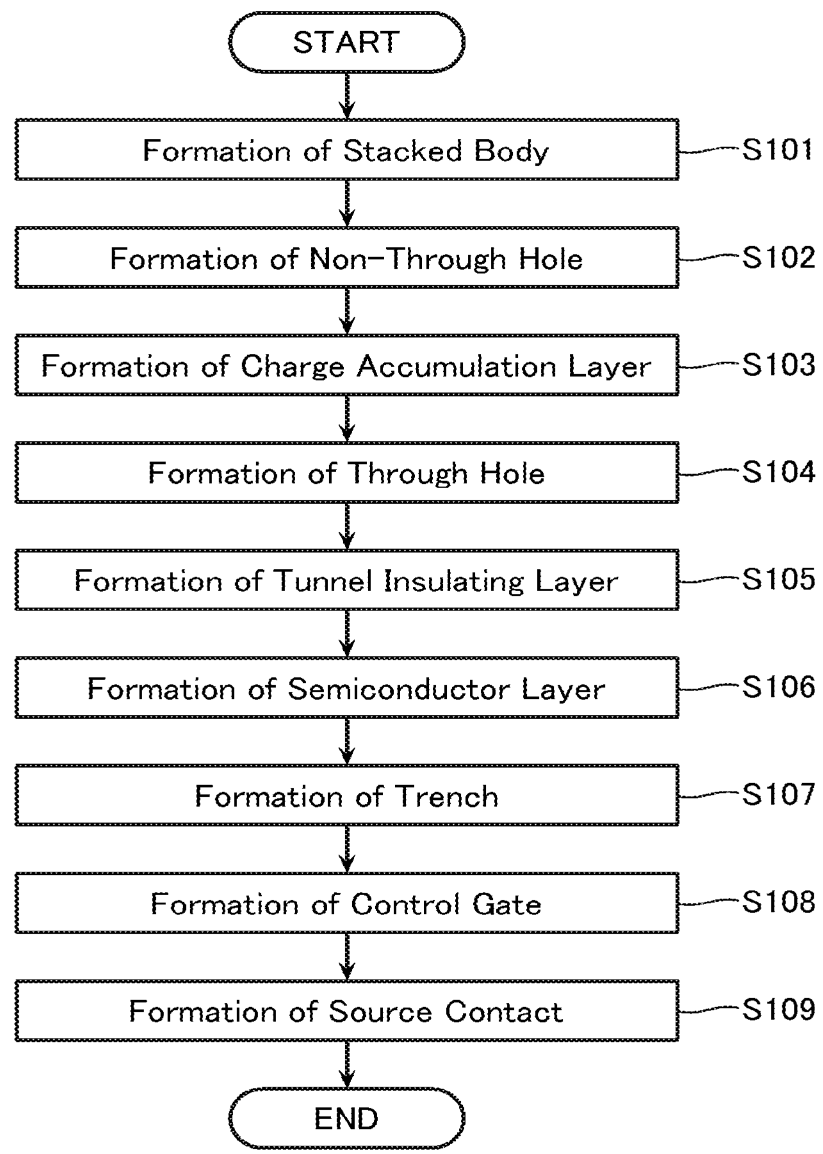
FIG. 7 is a flowchart showing a method of manufacturing the nonvolatile semiconductor memory device.

Next, a method of manufacturing the nonvolatile semiconductor memory device according to the first embodiment will be described with reference to FIGS. 7 to 18. FIG. 7 is a flowchart for explaining the method of manufacturing. FIGS. 8 to 18 are cross-sectional views for explaining the method of manufacturing.

Figure 8:
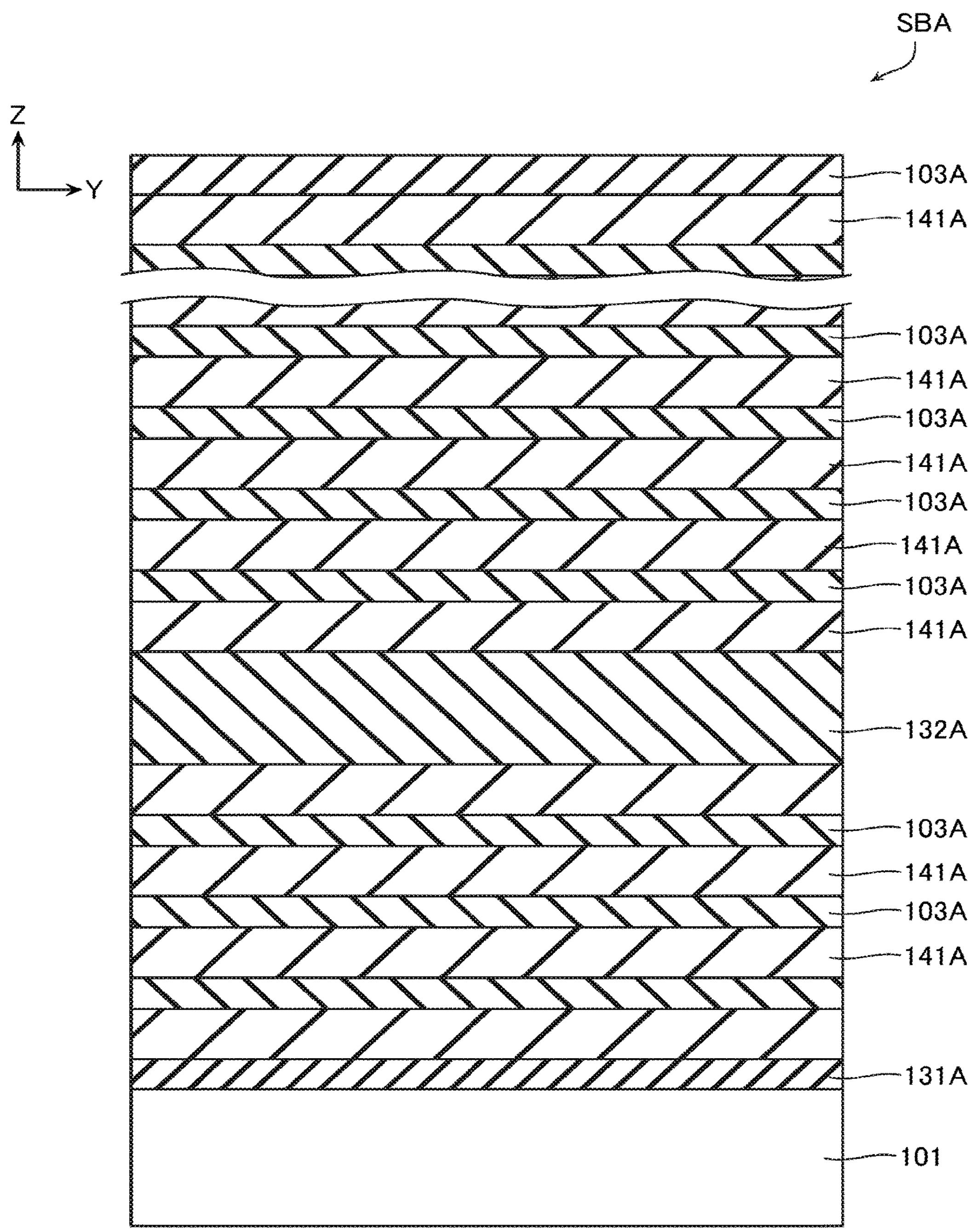
FIG. 8 is a cross-sectional view showing the method of manufacturing.

As shown in FIGS. 7 and 8, in step S101, a stacked body SBA is formed on the substrate 101. That is, as shown in FIG. 8, in step S101, an insulating layer 131A is stacked, a plurality of layers of insulating layers 103A which will be the inter-layer insulating layers 103, and sacrifice layers 141A are alternately stacked, an insulating layer 132A which will be the inter-layer insulating layer 132 is stacked, and a plurality of layers of the insulating layers 103A and sacrifice layers 141A are again alternately stacked on the substrate 101 to form the stacked body SBA. The insulating layer 131A, the insulating layer 103A, and the insulating layer 132A are formed from silicon oxide ($SiO_2$), for example. Moreover, the sacrifice layer 141A is formed from silicon nitride (SiN), for example.

Figure 9:
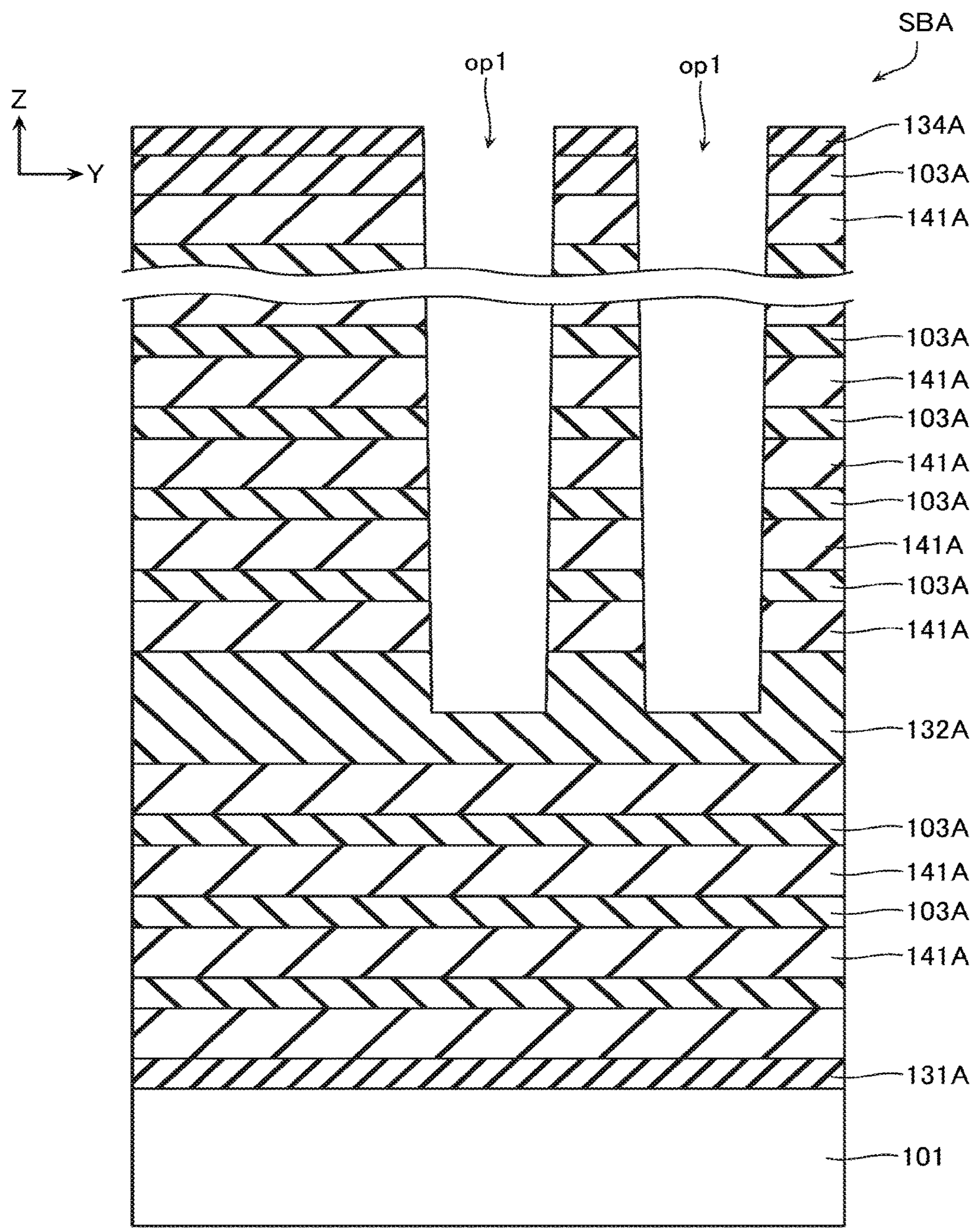
FIG. 9 is a cross-sectional view showing the method of manufacturing.

As shown in FIGS. 7 and 9, in step S102, a non-through hole (opening op1) that penetrates some of the insulating layers 103A and sacrifice layers 141A and does not penetrate this stacked body SBA, is formed. For example, first, an insulating layer 134A is formed on an upper surface of the stacked body SBA. A portion corresponding to the opening op1, of the insulating layer 134A is provided with an opening. Next, anisotropic etching such as RIE (Reactive Ion Etching) is performed using this insulating layer 134A as a mask, and the opening op1 is formed in the stacked body SBA. The opening op1 is formed such that part of the insulating layer 132A is removed and the insulating layer 132A is not penetrated. Therefore, the opening op1 penetrates the plurality of insulating layers 103A and sacrifice layers 141A stacked in a layer above the insulating layer 132A.

Figure 10:
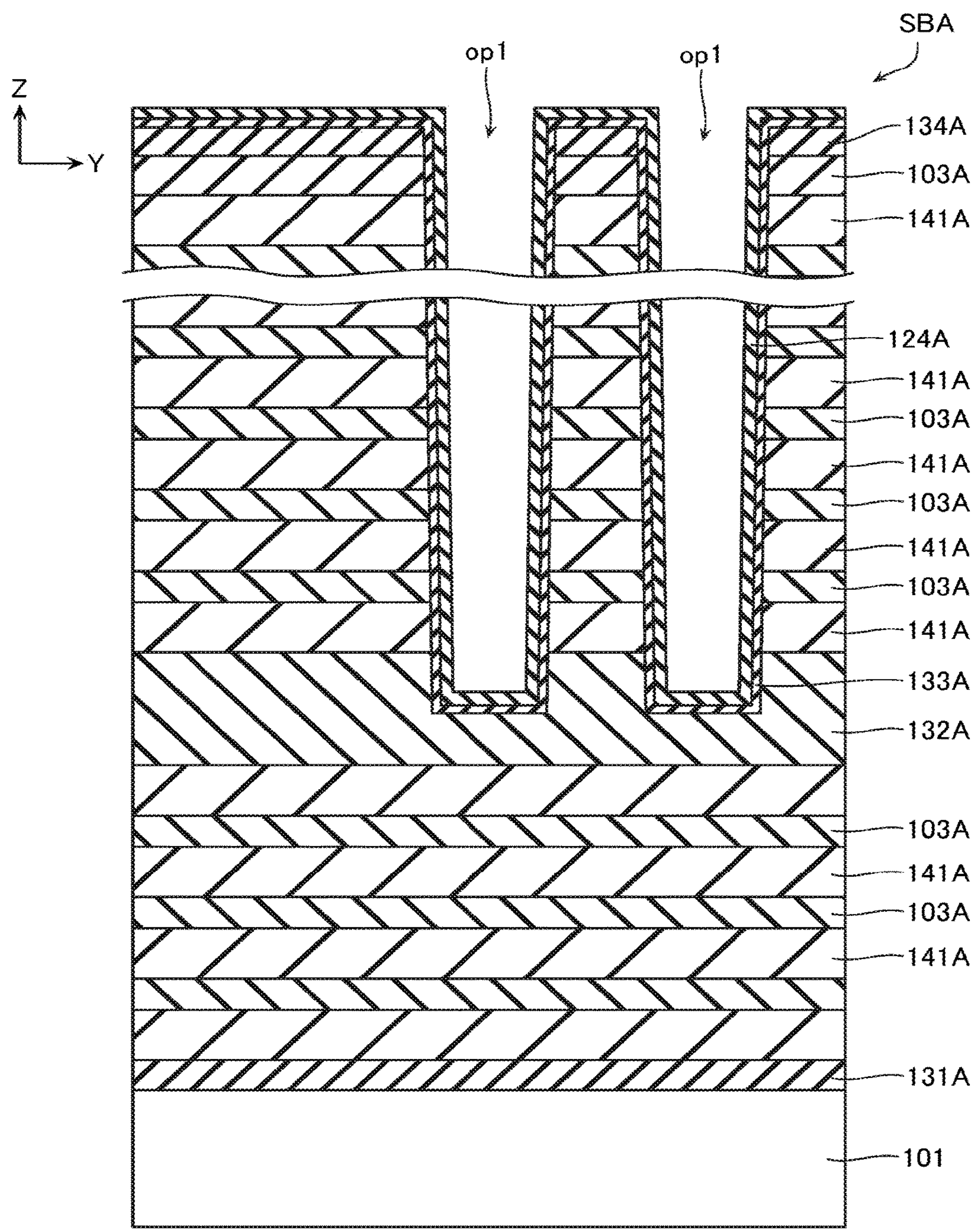
FIG. 10 is a cross-sectional view showing the method of manufacturing.

As shown in FIGS. 7 and 10, in step S103, an insulating layer 133A which will be the cover insulating layer 133 and a charge accumulation layer 124A which will be the charge accumulation layer 124, are formed. The insulating layer 133A and the charge accumulation layer 124A cover the upper surface of the stacked body SBA and an inner wall and bottom portion of the opening op1.

Figure 11:
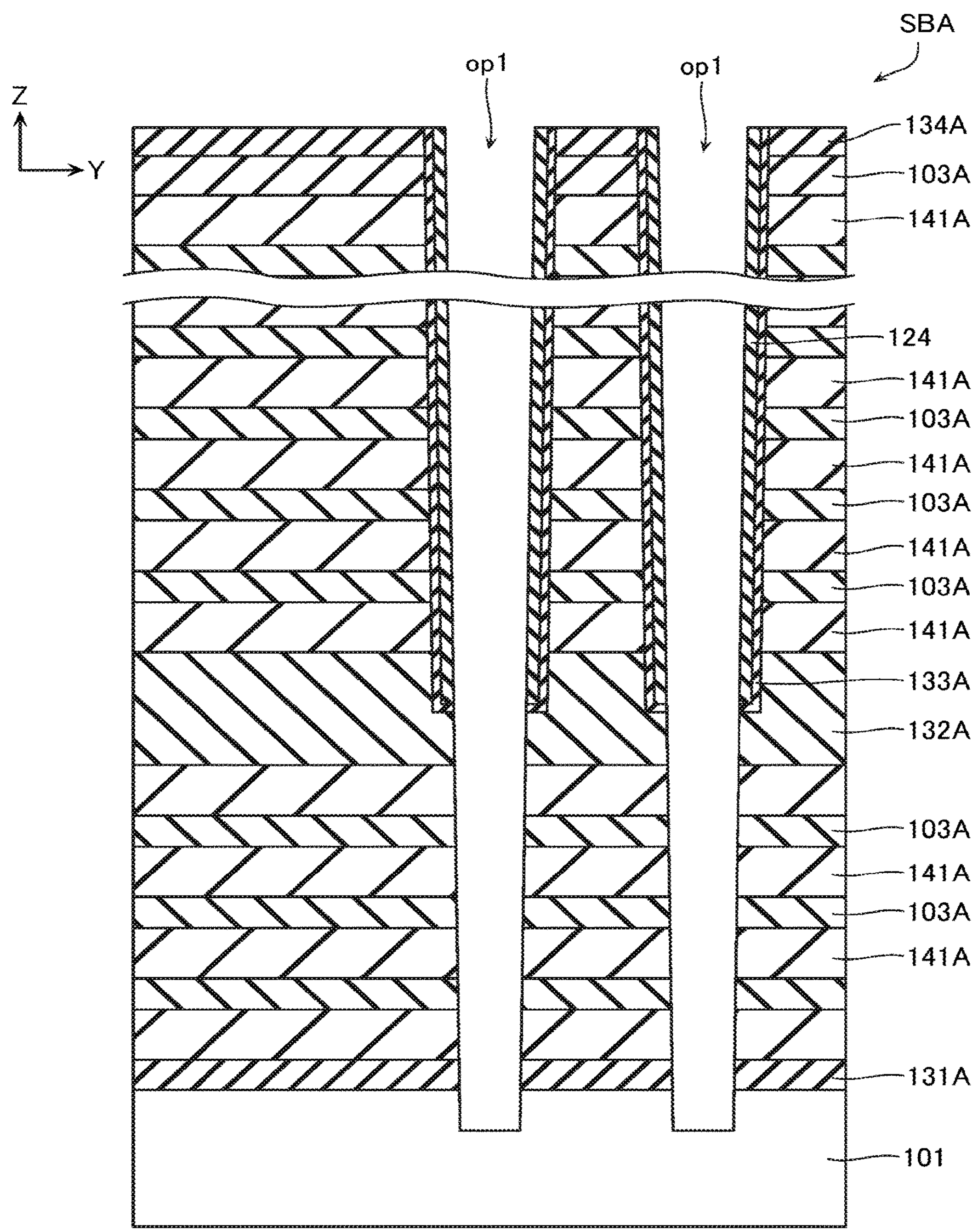
FIG. 11 is a cross-sectional view showing the method of manufacturing.

As shown in FIGS. 7 and 11, in step S104, a through hole that penetrates the stacked body SBA is formed. That is, the plurality of insulating layers 103A and sacrifice layers 141A positioned in the bottom portion of the opening op1, and the insulating layer 132A are removed to expose an upper surface of the substrate 101. Moreover, in step S104, portions positioned in the bottom portion of the opening op1 and portions covering the upper surface of the stacked body SBA, of the insulating layer 133A and the charge accumulation layer 124A, are removed. Note that in step S104, the upper surface of the substrate 101 is partially removed.

Note that in a case of the kind where, for example, an influence is exerted on the likes of film thickness of the charge accumulation layer 124A in step S104, it is also possible for a protective layer configured from the likes of amorphous silicon to be provided on the charge accumulation layer 124A in step S103, and for the through hole to be formed in this state. This protective layer may be subsequently removed. Moreover, it is also possible that after forming the through hole, a treatment by heat or radicals is performed, and film quality of the charge accumulation layer 124 is reformed.

Figure 12:
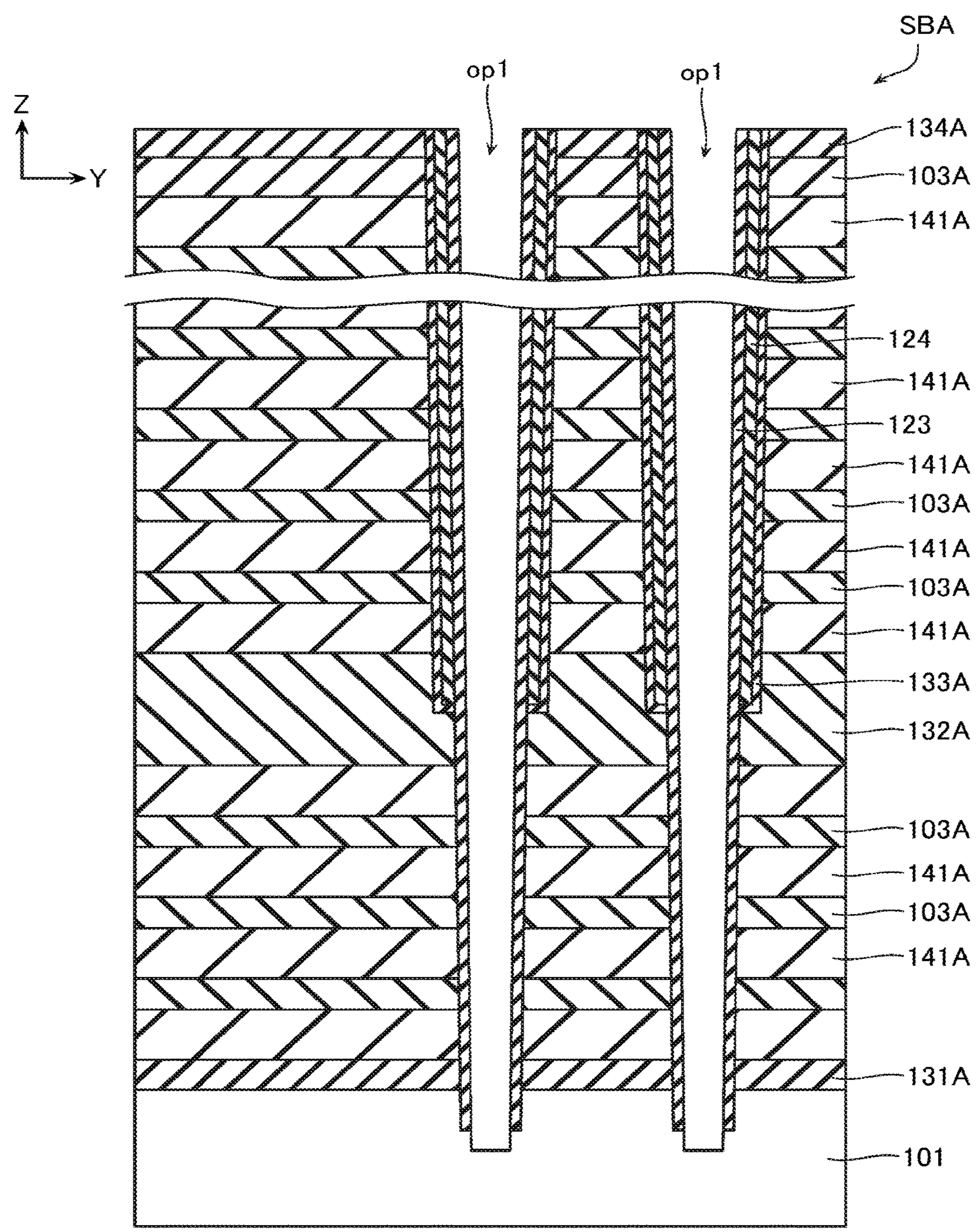
FIG. 12 is a cross-sectional view showing the method of manufacturing.

As shown in FIGS. 7 and 12, in step S105, the tunnel insulating layer 123 is formed on the inner wall of the opening op1. For example, an insulating layer which will be the tunnel insulating layer 123 is formed on the upper surface of the stacked body SBA and inner wall of the opening op1, and a portion covering the upper surface of the stacked body SBA and a portion covering the upper surface of the substrate 101, of this insulating layer, are removed. Note that when removing part of the insulating layer, the upper surface of the substrate 101 is partially removed.

Figure 13:
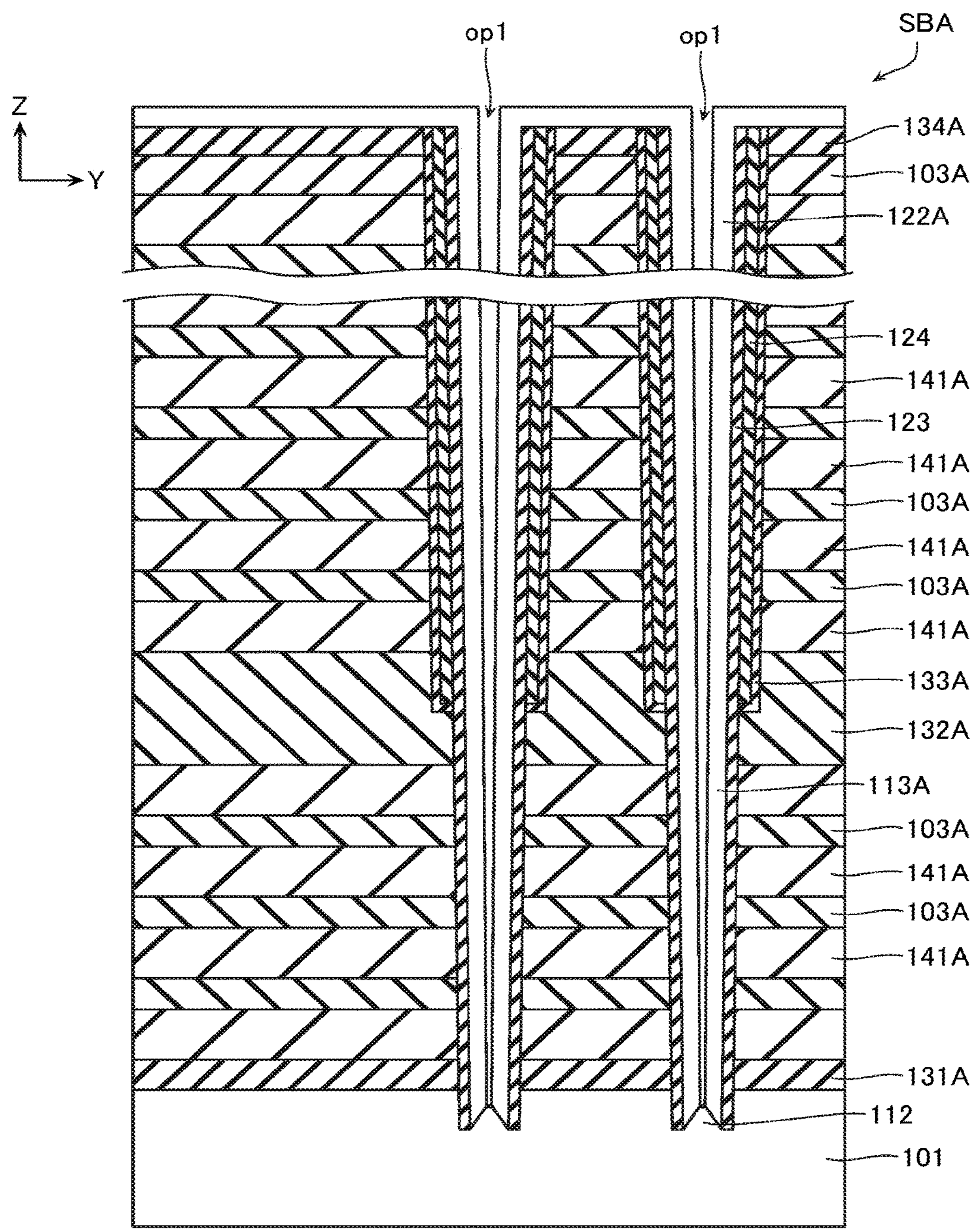
FIG. 13 is a cross-sectional view showing the method of manufacturing.
Figure 14:
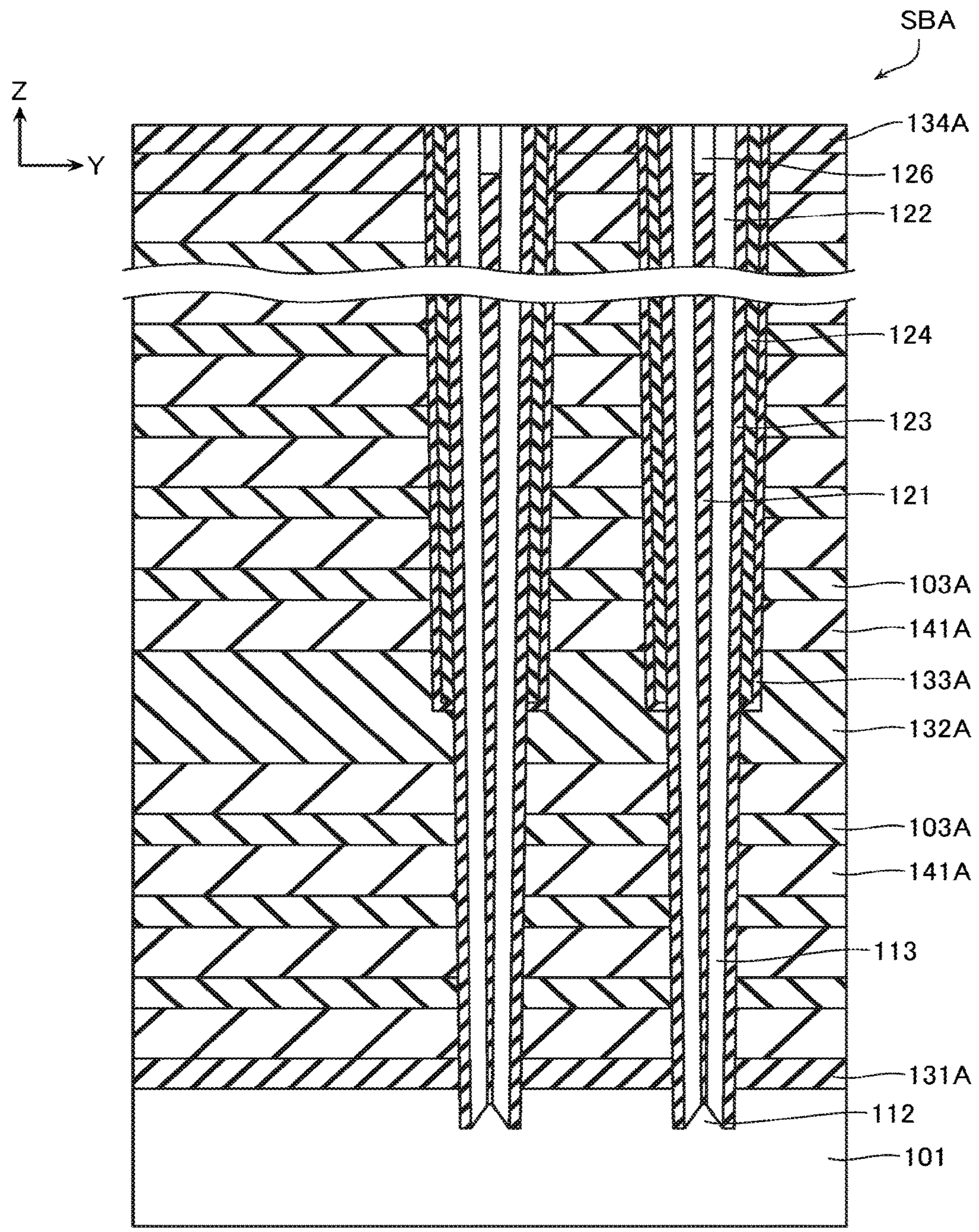
FIG. 14 is a cross-sectional view showing the method of manufacturing.

As shown in FIGS. 7, 13, and 14, in step S106, the semiconductor layer 122 functioning as the channel of the memory cell MC, and so on, is formed on the inside of the opening op1. For example, first, as shown in FIG. 13, a semiconductor layer 122A forming the semiconductor layer 122, is formed. The semiconductor layer 122A is formed by a method for growing a crystal, such as an epitaxial growth method. In this case, a monocrystal grows in the bottom portion of the opening op1 so as to match a crystalline structure of a substrate 101 surface, and will be the first portion 112 of the semiconductor layer 122. That is, the first portion 112 of the semiconductor layer 122 does not include an impurity or defect, and grows in a state of having an orientation of the substrate 101. In addition, a second portion 113A having an amorphous-state crystalline structure is formed on a side surface of the opening op1 and upper surface of the stacked body SBA. The second portion 113A of the semiconductor layer 122A will be the second portion 113 of the semiconductor layer 122. Note that when forming the semiconductor layer 122A, the semiconductor layer 122A may be grown employing the likes of a gas including a P type or N type impurity, such that the P type or N type impurity is included in the semiconductor layer 122A.

Next, as shown in FIG. 14, the core insulating layer 121 and a conductive layer 126 are implanted inside the opening op1, and smoothing by a means such as CMP (Chemical Mechanical Polishing) is performed using the insulating layer 134A, and so on, as a stopper. As a result, a portion positioned on the upper surface of the stacked body SBA, of the semiconductor layer 122A is removed. In addition, heat treatment, and so on, is performed and a crystalline structure of the amorphous-state second portion 113A is configured as a polycrystalline structure. As a result, the semiconductor layer 122 and the second portion 113 thereof are formed.

Figure 15:
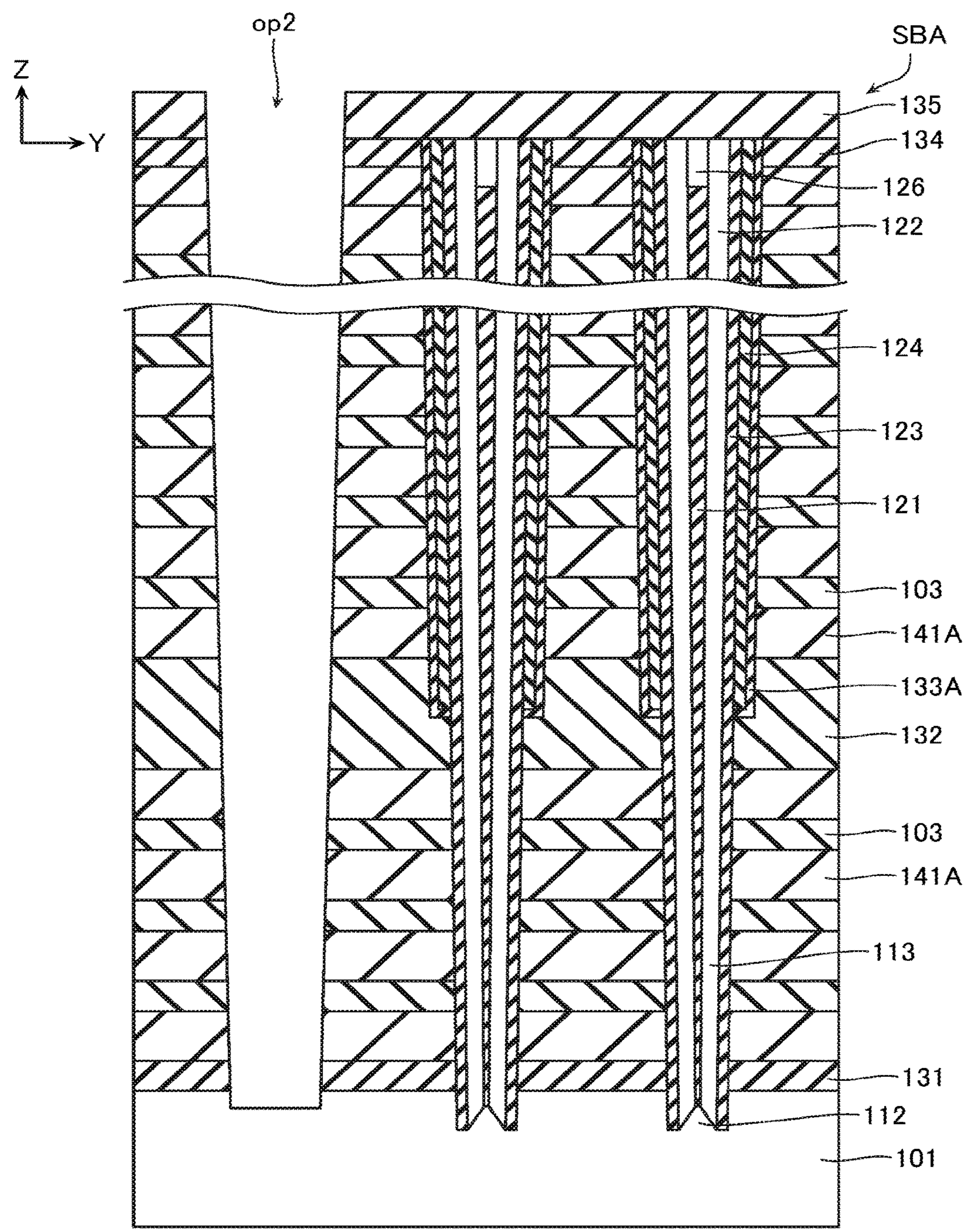
FIG. 15 is a cross-sectional view showing the method of manufacturing.

As shown in FIGS. 7 and 15, in step S107, a trench op2 that divides at least part of the stacked body SBA, is formed. For example, as shown in FIG. 15, an insulating layer 135 is formed on the upper surface of the stacked body SBA. A portion corresponding to the trench op2, of the insulating layer 135 is provided with a trench having a shape corresponding to the trench op2. Next, anisotropic etching such as RIE is performed using this insulating layer 135 as a mask, and the trench op2 penetrating the stacked body SBA, is formed. As a result, the insulating layer 131, the inter-layer insulating layer 103, the inter-layer insulating layer 132, and the insulating layer 134 are formed.

Figure 16:
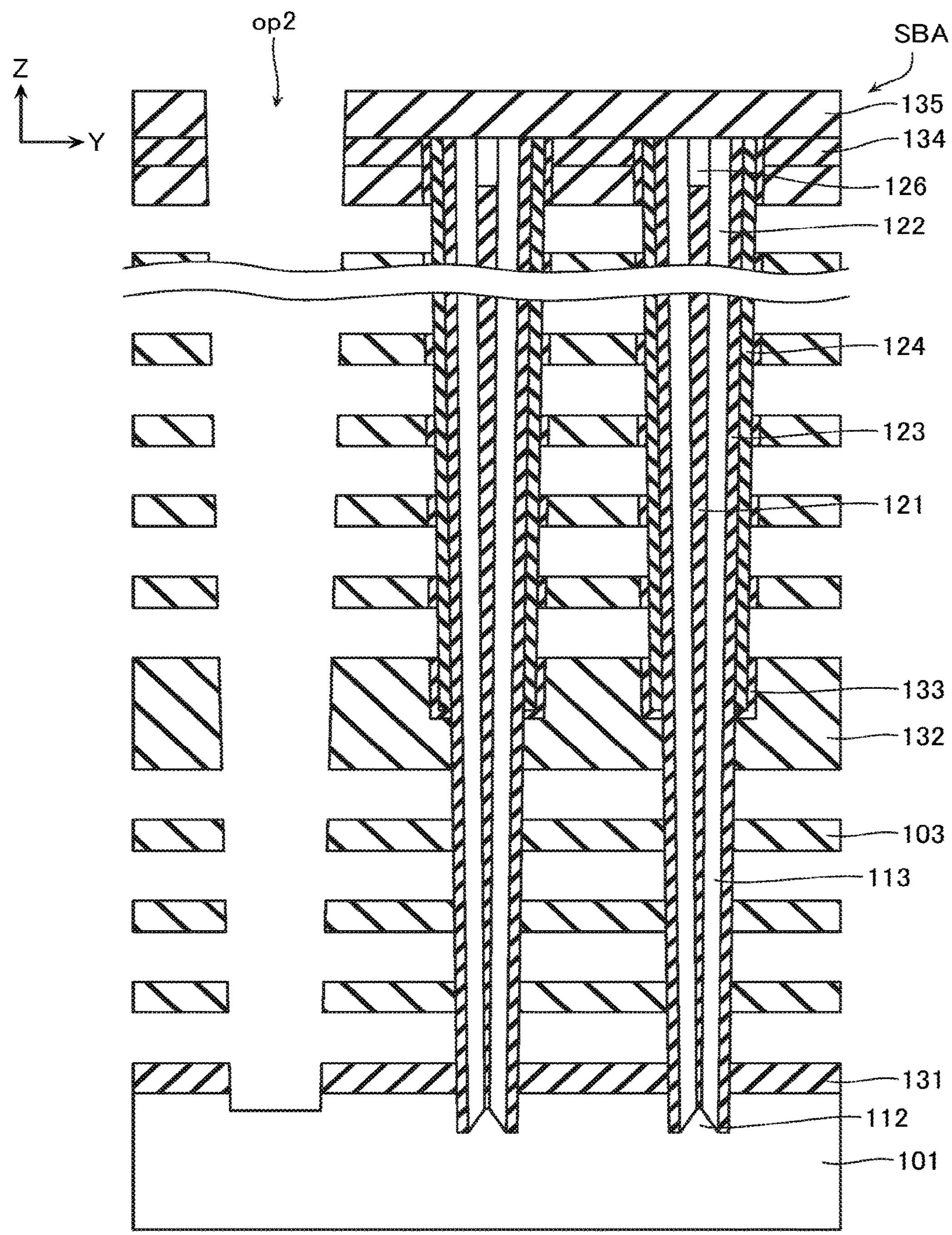
FIG. 16 is a cross-sectional view showing the method of manufacturing.

As shown in FIG. 7 and FIGS. 16 to 18, in step S108, the conductive layer 102 functioning as the control gate electrode of the memory cell MC, and so on, is formed. That is, as shown in FIG. 16, the sacrifice layer 141A is removed via the trench op2 by a means such as wet etching employing phosphoric acid. In addition, part of the insulating layer 133A is removed via the trench op2 by a means such as wet etching employing hydrofluoric acid. As a result, the cover insulating layer 133 is formed.

Figure 17:
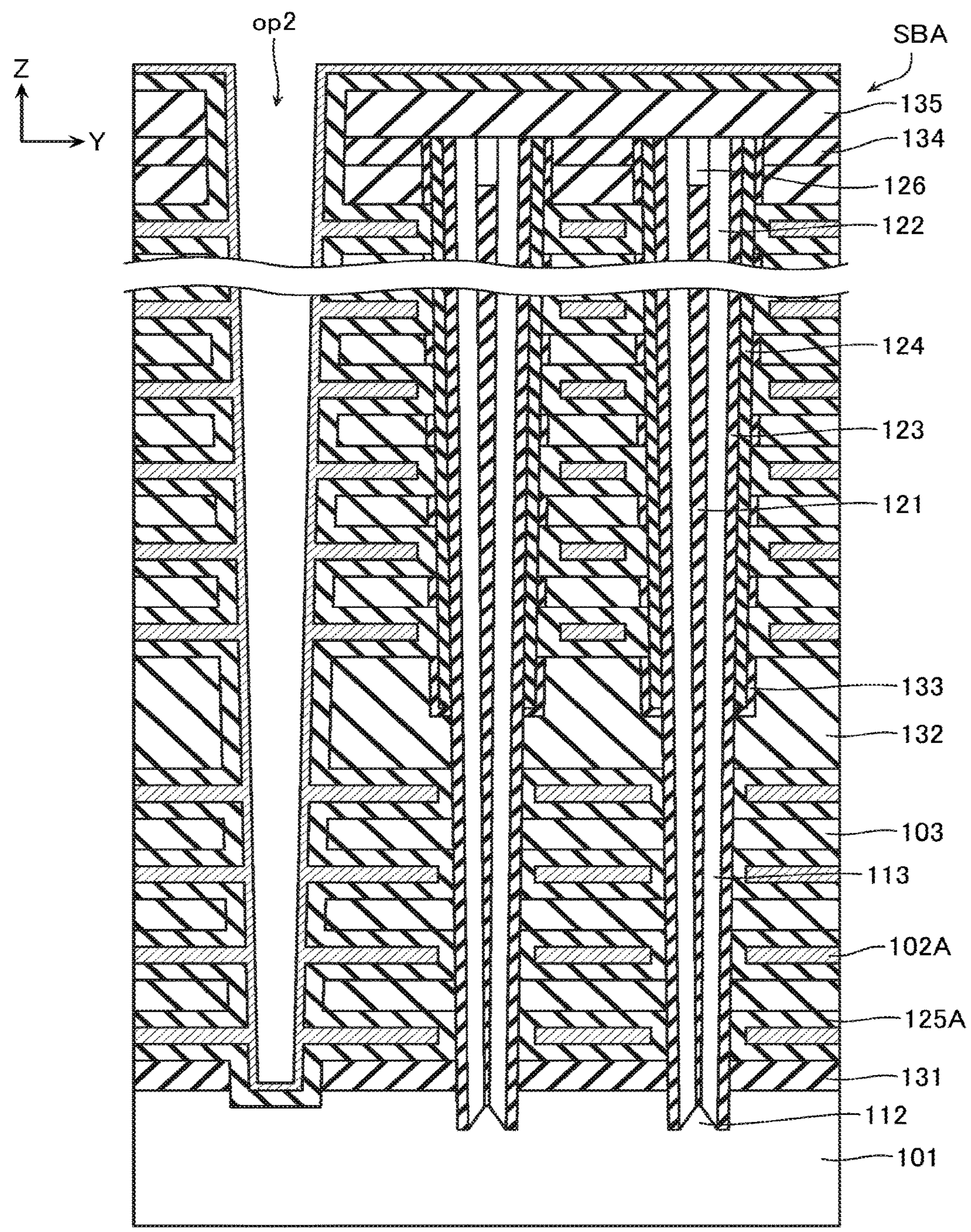
FIG. 17 is a cross-sectional view showing the method of manufacturing.

Next, as shown in FIG. 17, an insulating layer 125A which will be the block insulating layer 125 is formed, via the trench op2, on the upper surface of the substrate 101, an upper surface, lower surface, and side surface of the inter-layer insulating layer 103, side surfaces of the tunnel insulating layer 123 and charge accumulation layer 124, and the upper surface of the stacked body SBA. Moreover, a conductive layer 102A which will be the conductive layer 102 is formed in a portion between the inter-layer insulating layers 103 adjacent in a stacking direction.

Figure 18:
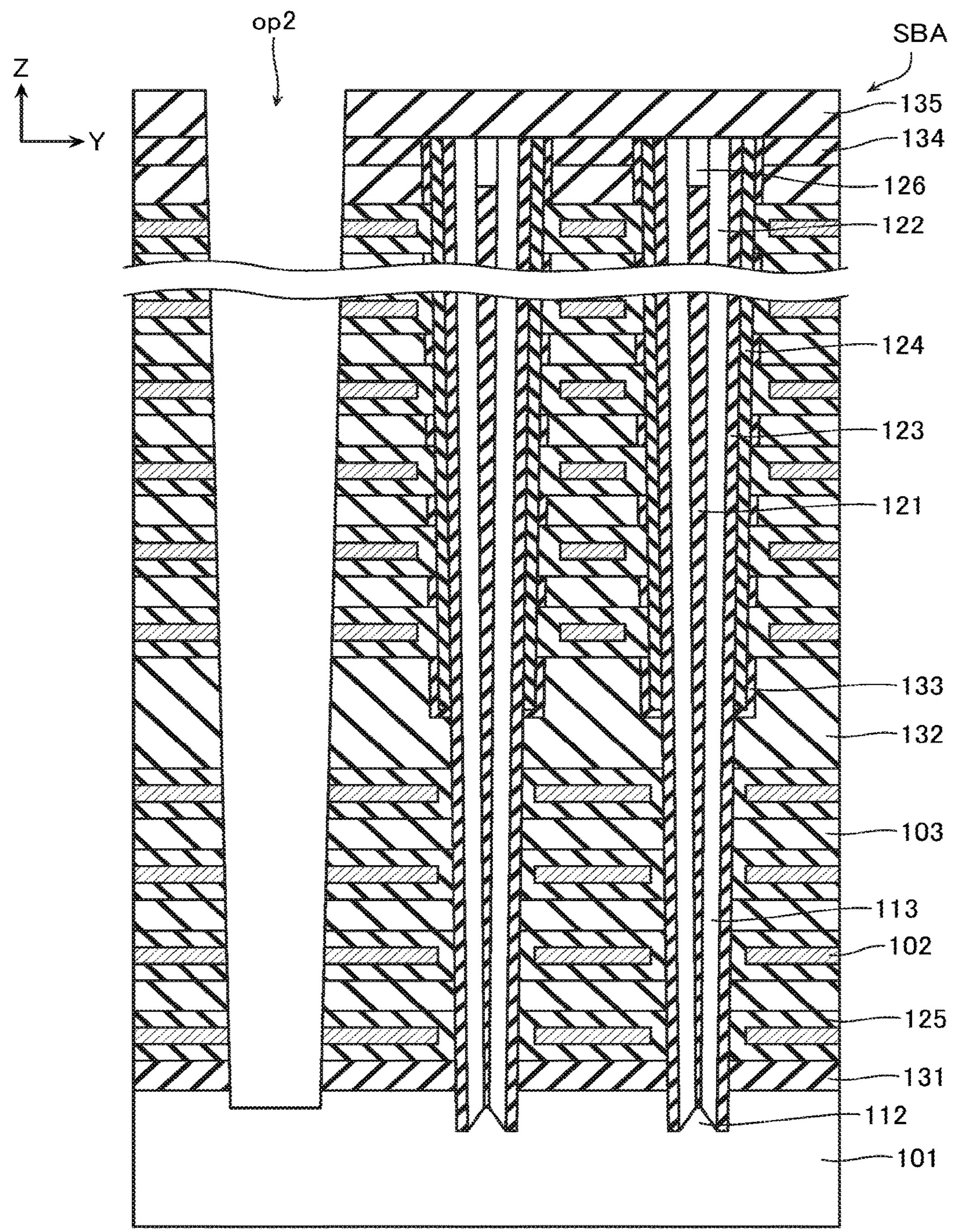
FIG. 18 is a cross-sectional view showing the method of manufacturing.

Next, as shown in FIG. 18, portions positioned on the upper surface of the stacked body SBA and sidewall of the trench op2, of the insulating layer 125A and the conductive layer 102A, are removed. As a result, the block insulating layer 125 and the conductive layer 102 divided in the Z direction, are formed.

Subsequently, as shown in FIGS. 7 and 5, in step S109, a spacer insulating layer 136 and the conductive layer 108 are formed, a through hole penetrating the spacer insulating layer 136 and the insulating layer 135 is formed at an upper portion of the memory columnar body 105, and the bit line contact 137 is formed in this through hole. As a result, the nonvolatile semiconductor memory device described with reference to FIG. 5 is manufactured.

Now, in the method of manufacturing the nonvolatile semiconductor memory device according to the present embodiment, in step S102, the non-through hole is formed in the stacked body SBA (refer to FIG. 9), and the charge accumulation layer 124A is formed in this non-through hole (refer to FIG. 10). Subsequently, in step S104, the through hole is formed in the stacked body SBA (refer to FIG. 11), and the semiconductor layer 113A is formed in this through hole (refer to FIG. 13). As a result, as described with reference to FIG. 5, a position of the lower end of the charge accumulation layer 124 can be formed more upwardly than the substrate 101.

Note that in the present embodiment, in step S104, the through hole is formed in the stacked body SBA (refer to FIG. 11), and the semiconductor layer 113A is formed in this through hole (refer to FIG. 13). Therefore, as shown in FIG. 5, the semiconductor layer 122 is formed integrally in a range from a portion configuring the source side select gate transistor STS to a portion configuring the memory cell MC. Moreover, a sidewall of the semiconductor layer 122 is formed continuously in the range from the portion configuring the source side select gate transistor STS to the portion configuring the memory cell MC.

Moreover, in the present embodiment, in step S102, the non-through hole is formed in the stacked body SBA (refer to FIG. 9), and the insulating layer 133A and charge accumulation layer 124A are formed in this non-through hole (refer to FIG. 10). Subsequently, in step S104, the through hole is formed in the stacked body SBA (refer to FIG. 11), and the tunnel insulating layer 123 is formed in this through hole (refer to FIG. 12). Therefore, as shown in FIG. 5, in the nonvolatile semiconductor memory device manufactured by the method of manufacturing according to the present embodiment, it is configured that the lower end of the tunnel insulating layer 123 is positioned more downwardly than the upper surface of the substrate 101 and the lower ends of the cover insulating layer 133 and charge accumulation layer 124 are positioned more upwardly than the substrate 101 (in the example shown in FIG. 5, between the first stacked portion 151 and the second stacked portion 152).

Second Embodiment

Figure 19:
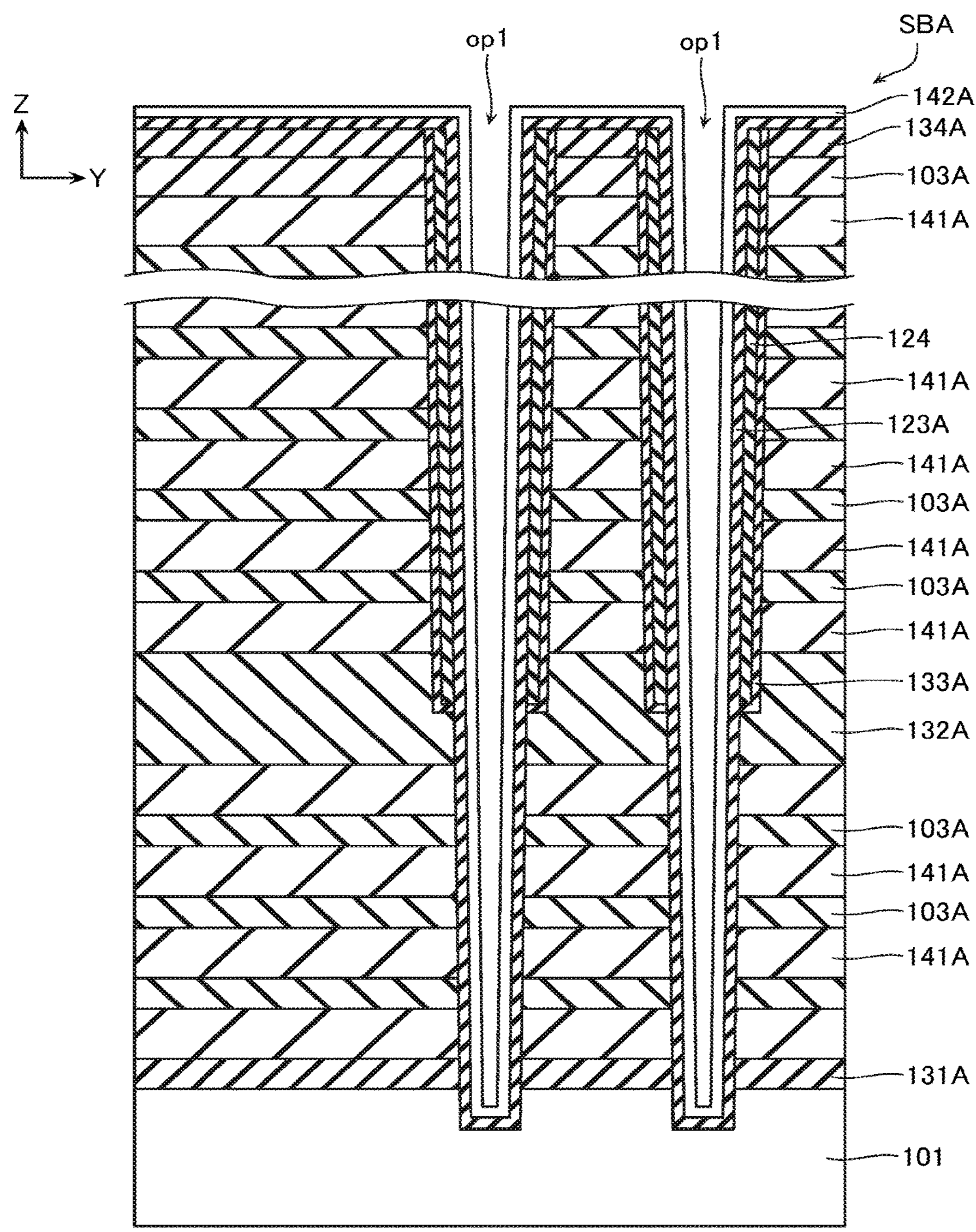
FIG. 19 is a cross-sectional view showing a method of manufacturing a nonvolatile semiconductor memory device according to a second embodiment.
Figure 20:
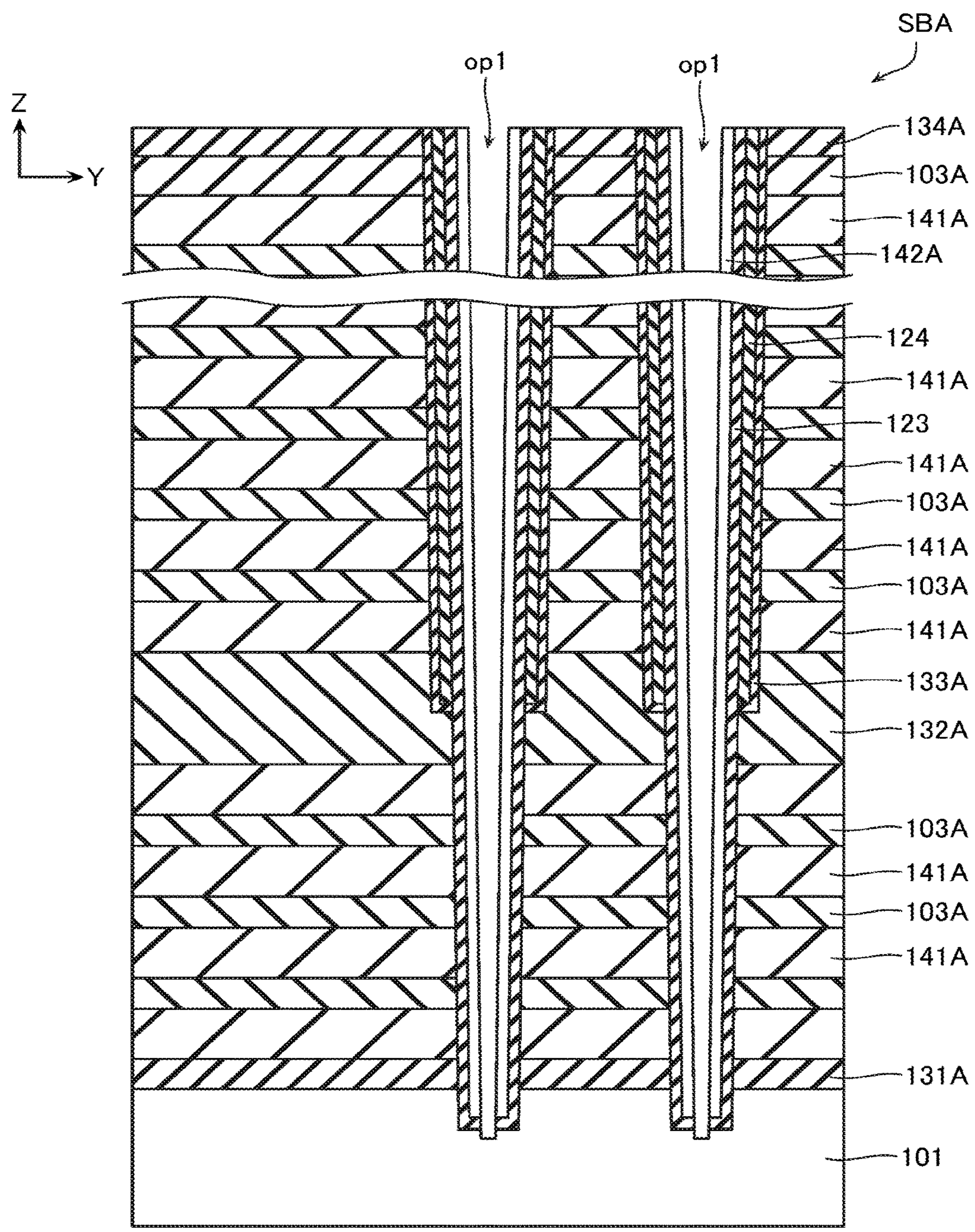
FIG. 20 is a cross-sectional view showing the method of manufacturing.
Figure 21:
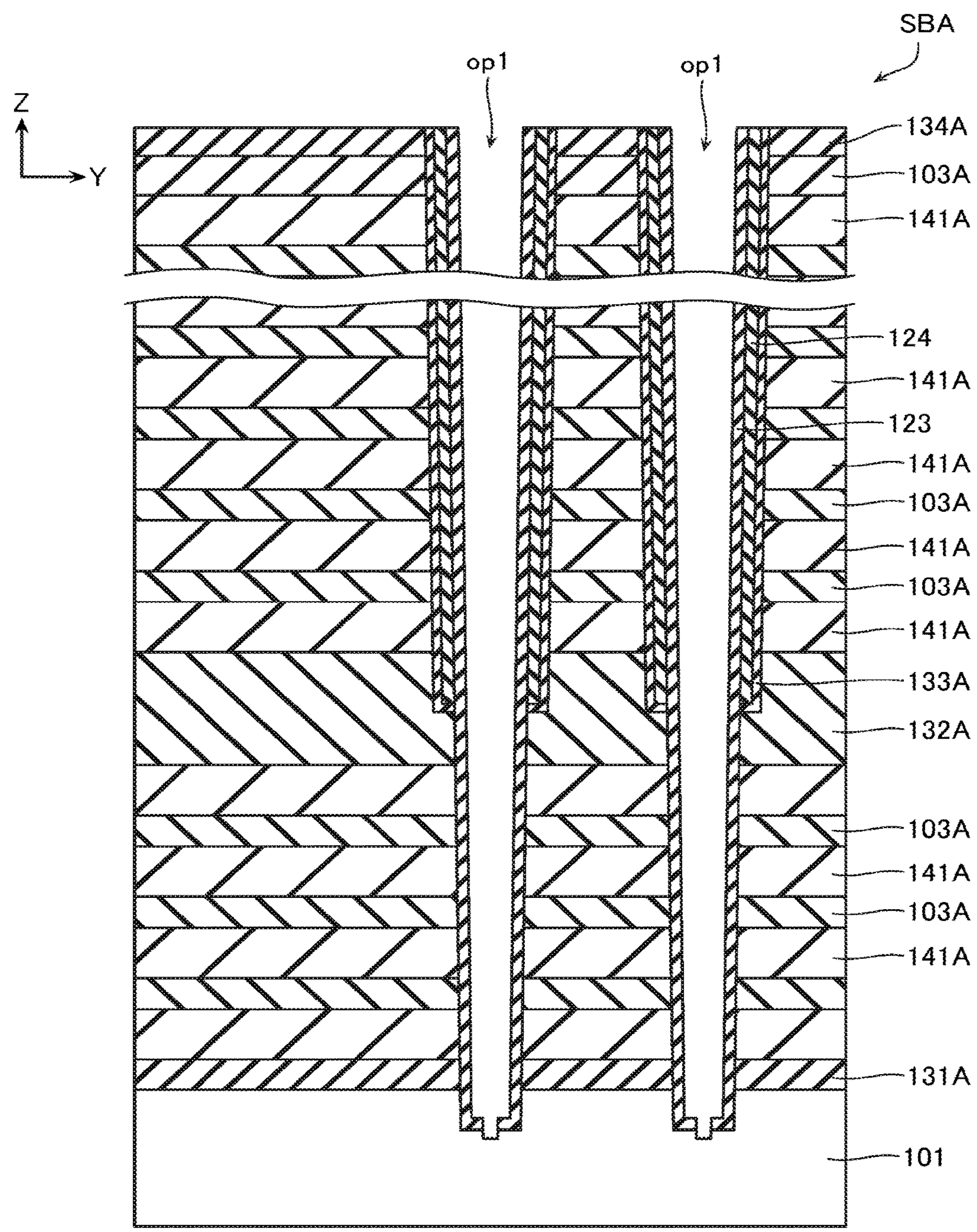
FIG. 21 is a cross-sectional view showing the method of manufacturing.

Next, a method of manufacturing a nonvolatile semiconductor memory device according to a second embodiment will be described with reference to FIGS. 19 to 21. FIGS. 19 to 21 are cross-sectional view showing the method of manufacturing. Note that in the description below, portions similar to those of the first embodiment are assigned with reference symbols similar to those assigned in the first embodiment, and descriptions thereof will be omitted.

The method of manufacturing according to the second embodiment makes it possible to manufacture a nonvolatile semiconductor memory device having a configuration substantially similar to that of the nonvolatile semiconductor memory device according to the first embodiment. The method of manufacturing according to the present embodiment is basically performed similarly to the method of manufacturing according to the first embodiment, but the step for forming the tunnel insulating layer, namely step S105, described with reference to FIGS. 7 and 12, is different.

That is, the method of manufacturing according to the present embodiment is performed similarly to the method of manufacturing according to the first embodiment for steps from step S101 to step S104.

As shown in FIG. 19, in the method of manufacturing according to the present embodiment, in step S105, first, the insulating layer 123A forming the tunnel insulating layer 123 is formed on the upper surface of the stacked body SBA and the side surface of the opening op1. In addition, a protective layer 142A is formed on the upper surface and side surface of this insulating layer 123A. The protective layer 142A is formed from the likes of amorphous-state silicon, for example.

Next, as shown in FIG. 20, portions positioned in the bottom portion of the opening op1 and portions positioned on the upper surface of the stacked body SBA, of the insulating layer 123A and the protective layer 142A, are removed and the tunnel insulating layer 123 is formed. Next, as shown in FIG. 21, the protective layer 142A is removed.

Subsequently, steps from step S106 onward, of the method of manufacturing according to the first embodiment are performed, whereby the nonvolatile semiconductor memory device according to the second embodiment is manufactured.

In the present embodiment, in the step described with reference to FIG. 20, a portion which will be the tunnel insulating layer 123, of the insulating layer 123A is covered by the protective layer 142A, and the portion positioned in the bottom portion of the opening op1, of the insulating layer 123A is removed in this state. Therefore, the insulating layer 123A is protected by the protective layer 142A, whereby a tunnel insulating layer 123 having a good quality film quality can be formed.

Third Embodiment

Figure 22:
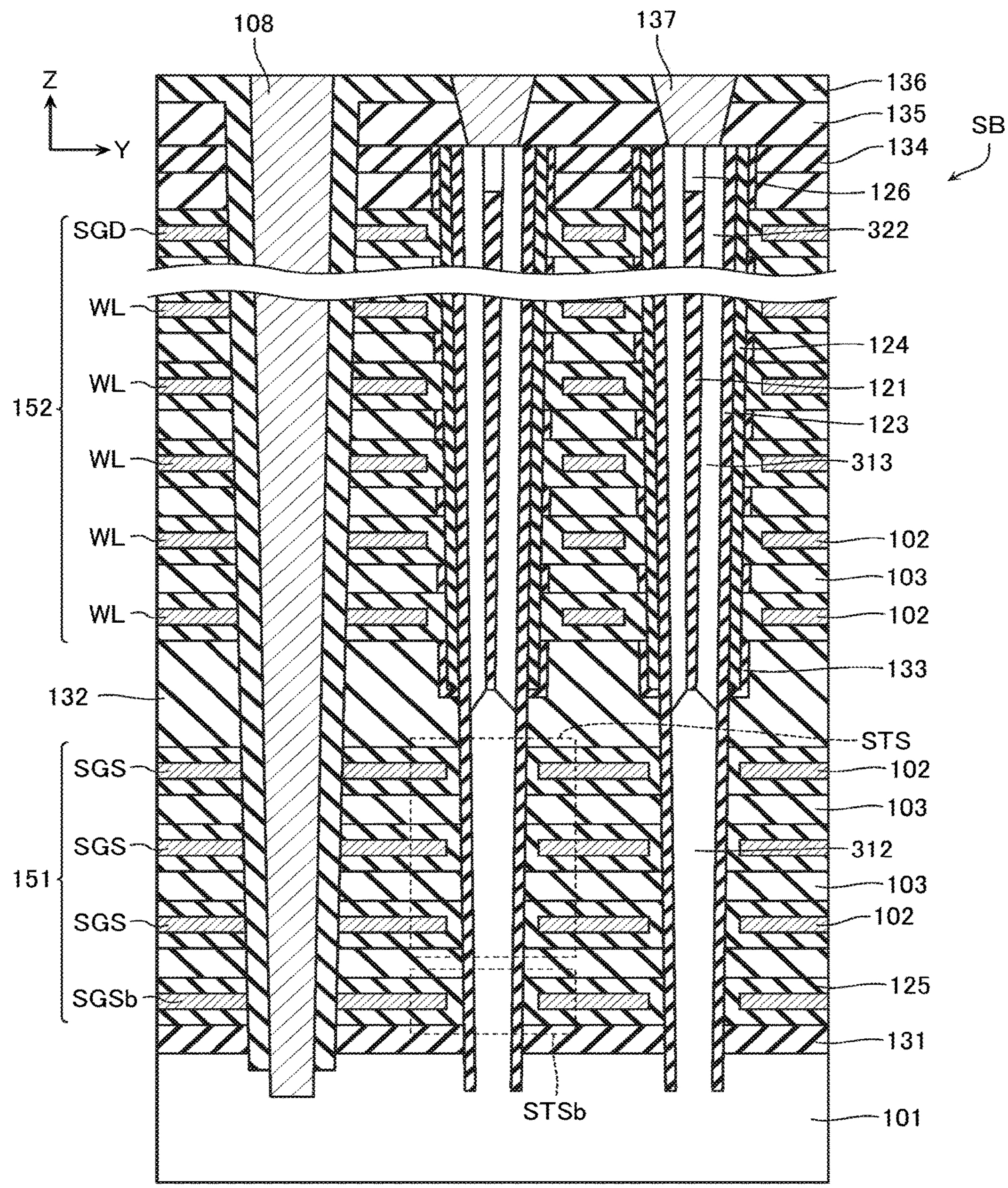
FIG. 22 is a cross-sectional view showing a configuration of part of a nonvolatile semiconductor memory device according to a third embodiment.

Next, a nonvolatile semiconductor memory device according to a third embodiment will be described with reference to FIG. 22. FIG. 22 is a cross-sectional view showing a configuration of part of the nonvolatile semiconductor memory device. Note that in the description below, portions similar to those of the first embodiment are assigned with reference symbols identical to those assigned in the first embodiment, and descriptions thereof will be omitted.

As shown in FIG. 22, the nonvolatile semiconductor memory device according to the present embodiment is basically configured similarly to the nonvolatile semiconductor memory device according to the first embodiment, but a configuration of a semiconductor layer 322 is different. That is, the semiconductor layer 322 according to the present embodiment is basically configured similarly to the semiconductor layer 122 described with reference to FIG. 5, but a first portion 312 of the semiconductor layer 322 according to the present embodiment has a columnar shape having the Z direction as its longer direction. Moreover, in the semiconductor layer 322 according to the present embodiment, a boundary of the first portion 312 and a second portion 313 is positioned between the first stacked portion 151 and the second stacked portion 152 of the stacked body SB.

The first portion 312 of the semiconductor layer 322, similarly to the first portion 112 according to the first embodiment, is formed integrally with the substrate 101, and is formed from a semiconductor such as silicon having a monocrystalline structure. Therefore, the source side select gate transistor STS and the lowermost layer source side select gate transistor STSb according to the present embodiment resultantly include a channel configured from a semiconductor having a monocrystalline structure. Therefore, in the present embodiment, channel resistance of the source side select gate transistor STS and the lowermost layer source side select gate transistor STSb can be reduced more compared to in the first embodiment.

Figure 23:
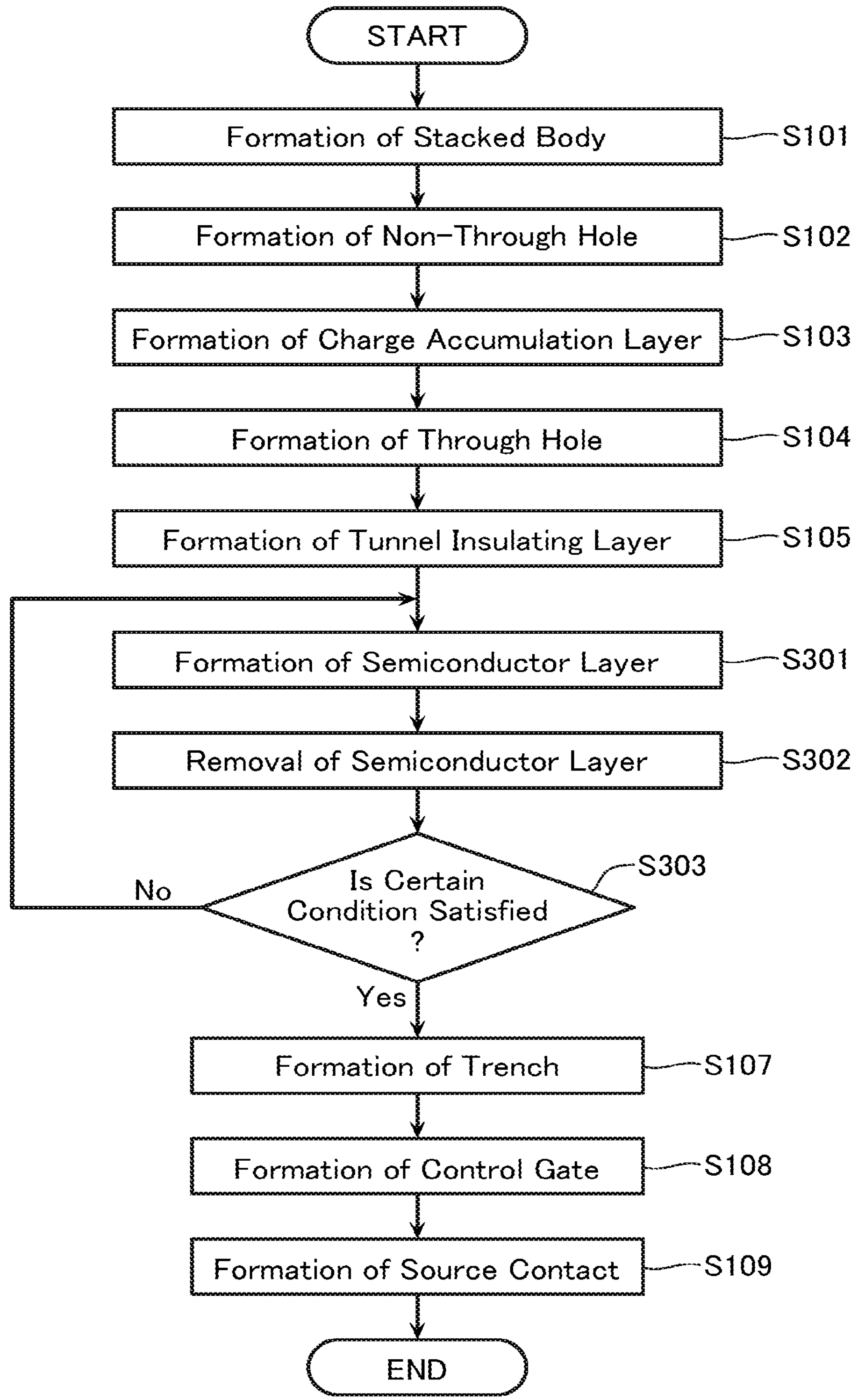
FIG. 23 is a flowchart showing a method of manufacturing the nonvolatile semiconductor memory device.
Figure 24:
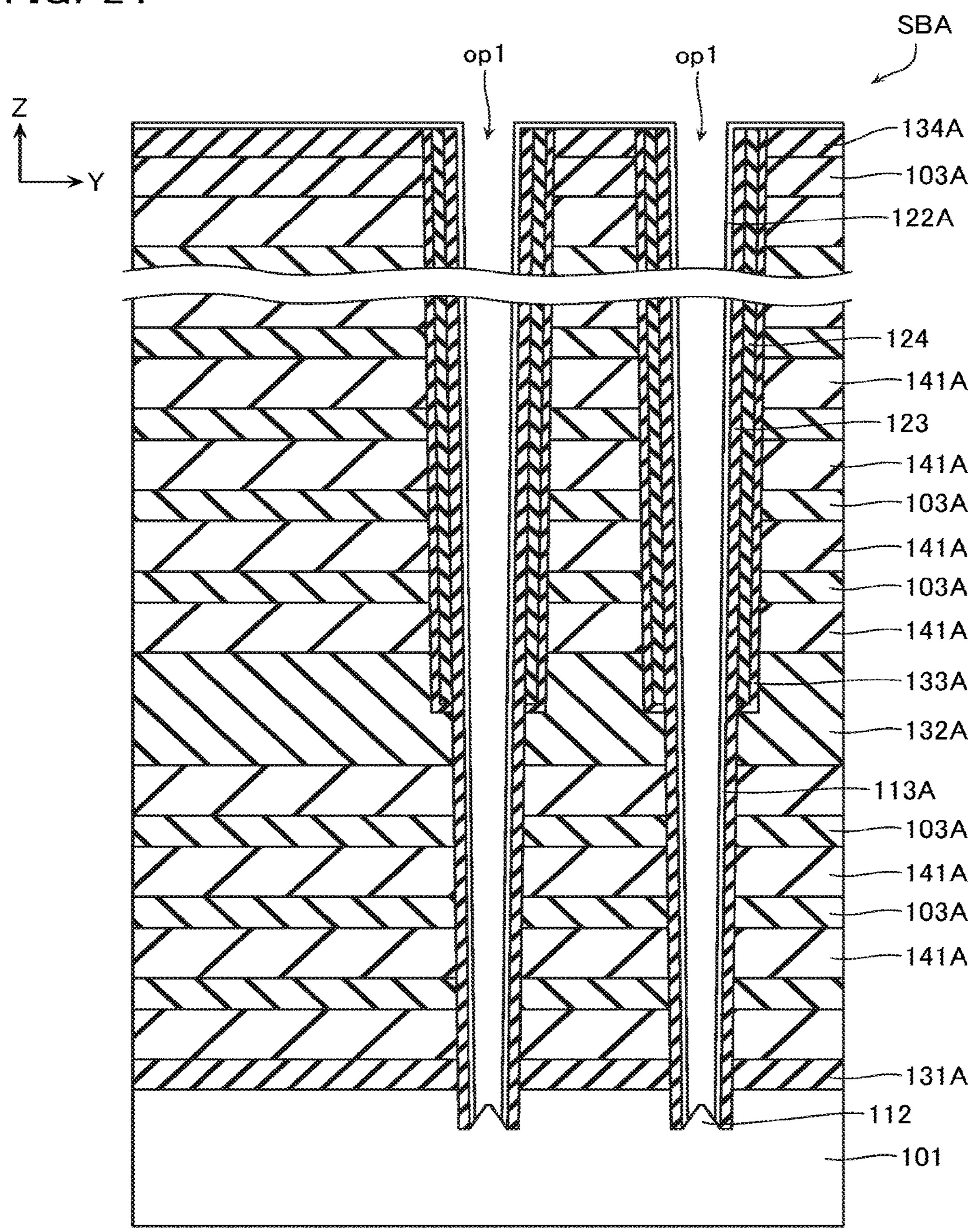
FIG. 24 is a cross-sectional view showing the method of manufacturing.
Figure 25:
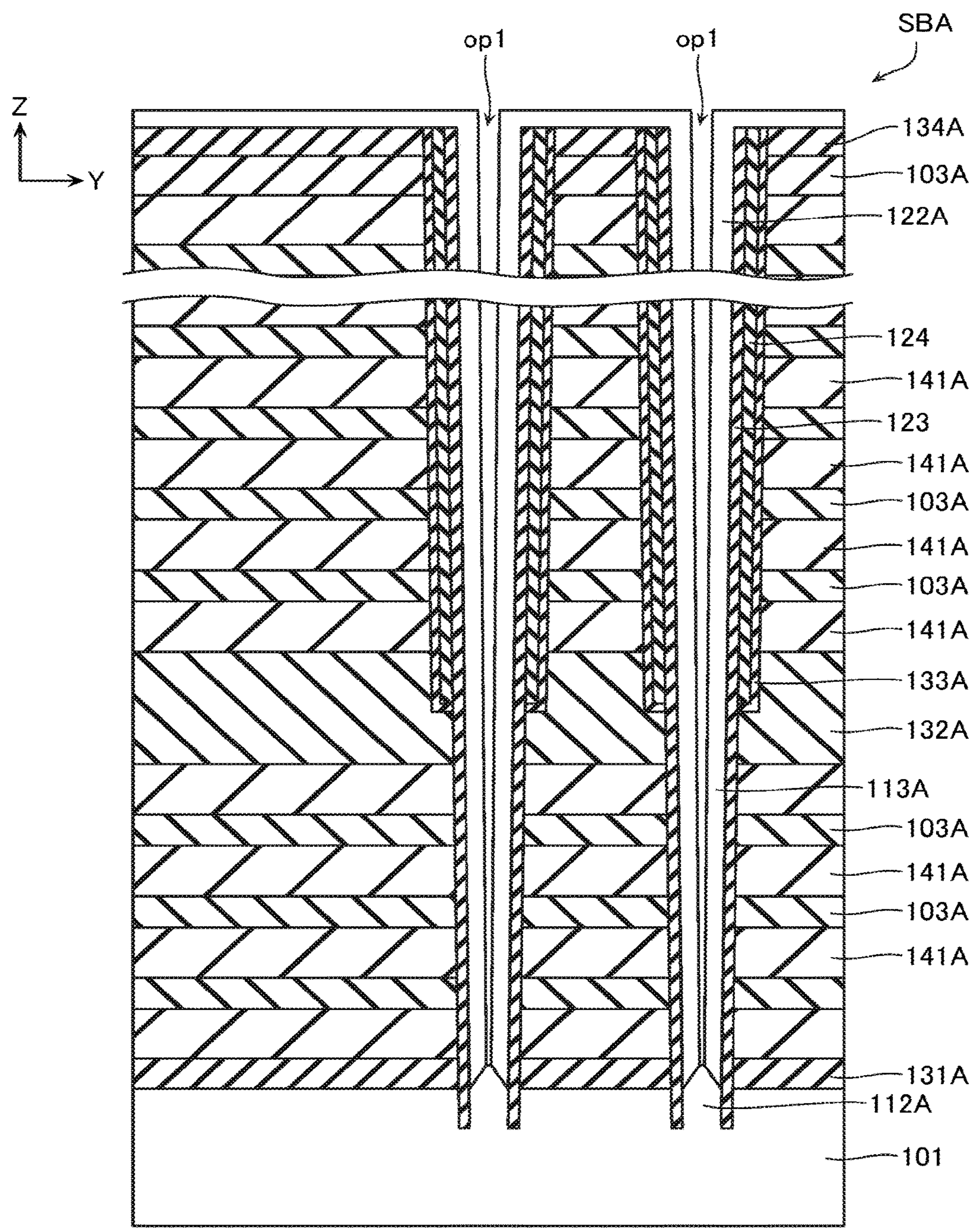
FIG. 25 is a cross-sectional view showing the method of manufacturing.
Figure 26:
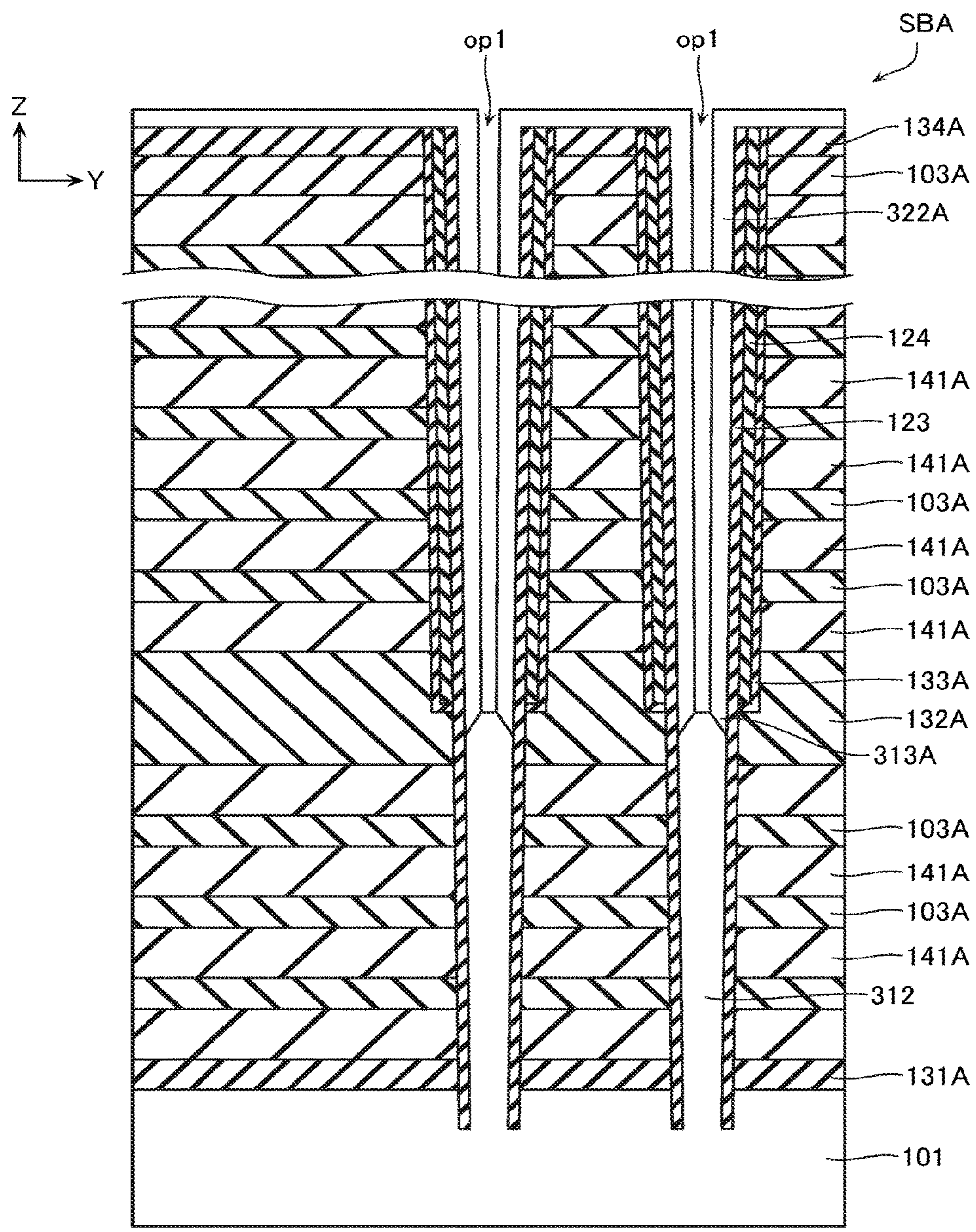
FIG. 26 is a cross-sectional view showing the method of manufacturing.

Next, a method of manufacturing the nonvolatile semiconductor memory device according to the third embodiment will be described with reference to FIGS. 23 to 26. FIG. 23 is a flowchart for explaining the method of manufacturing. FIGS. 24 to 26 are cross-sectional views showing the method of manufacturing.

As shown in FIG. 23, the method of manufacturing according to the present embodiment is basically performed similarly to the method of manufacturing according to the first embodiment, but a step corresponding to the step for forming the semiconductor layer, namely step S106, is different. That is, as shown in FIG. 23, in the method of manufacturing according to the present embodiment, a step for forming the semiconductor layer (step S301) and a step for removing the semiconductor layer (step S302) are repeatedly performed until a certain condition is satisfied (step S303).

That is, in the method of manufacturing according to the present embodiment, first, steps from step S101 to step S105 are performed by a method similar to the method of manufacturing according to the first embodiment. Next, step S301 is performed. Step S301 is performed similarly to the step for forming the semiconductor layer, namely step S106, described with reference to FIG. 13.

As shown in FIGS. 23 and 24, in step S302, part of the semiconductor layer 122A is removed. Now, step S302 is performed under such a condition that the second portion 113A having an amorphous crystalline structure is removed faster than the first portion 112 having a monocrystalline structure. This step is performed by the likes of anisotropic etching employing a gas such as chlorine ($Cl_2$), for example. As shown in FIG. 24, this step may be performed such that the second portion 113A of the semiconductor layer 122A is partially left, or may be performed such that the second portion 113A is completely removed.

As shown in FIG. 23, when it has been determined in step S303 that the certain condition has not been satisfied, step S301 is performed again. As a result, as shown in FIG. 25, the first portion 112A of the semiconductor layer 122A having a monocrystalline structure grows in the Z direction along the opening op1. In addition, the second portion 113A of the semiconductor layer 122A having an amorphous crystalline structure grows again.

Thus, as shown in FIG. 26, by repeatedly performing step S301 and step S302, a monocrystalline portion of the semiconductor layer is gradually grown along the opening op1, and the first portion 312 of the semiconductor layer 322A is formed. Note that in the example shown in FIG. 26, the first portion 312 of the semiconductor layer 322A grows along the inner wall of the opening op1 so as to contact the inner wall of the opening op1.

Subsequently, steps from step S107 onward, of the method of manufacturing according to the first embodiment are performed, whereby the nonvolatile semiconductor memory device according to the third embodiment is manufactured.

Note that in the present embodiment, the certain condition in step S303 was set to be such that an upper end of the first portion 312 of the semiconductor layer 322 is positioned between the first stacked portion 151 and the second stacked portion 152 of the stacked body SB. However, this certain condition may be appropriately changed.

Fourth Embodiment

Figure 27:
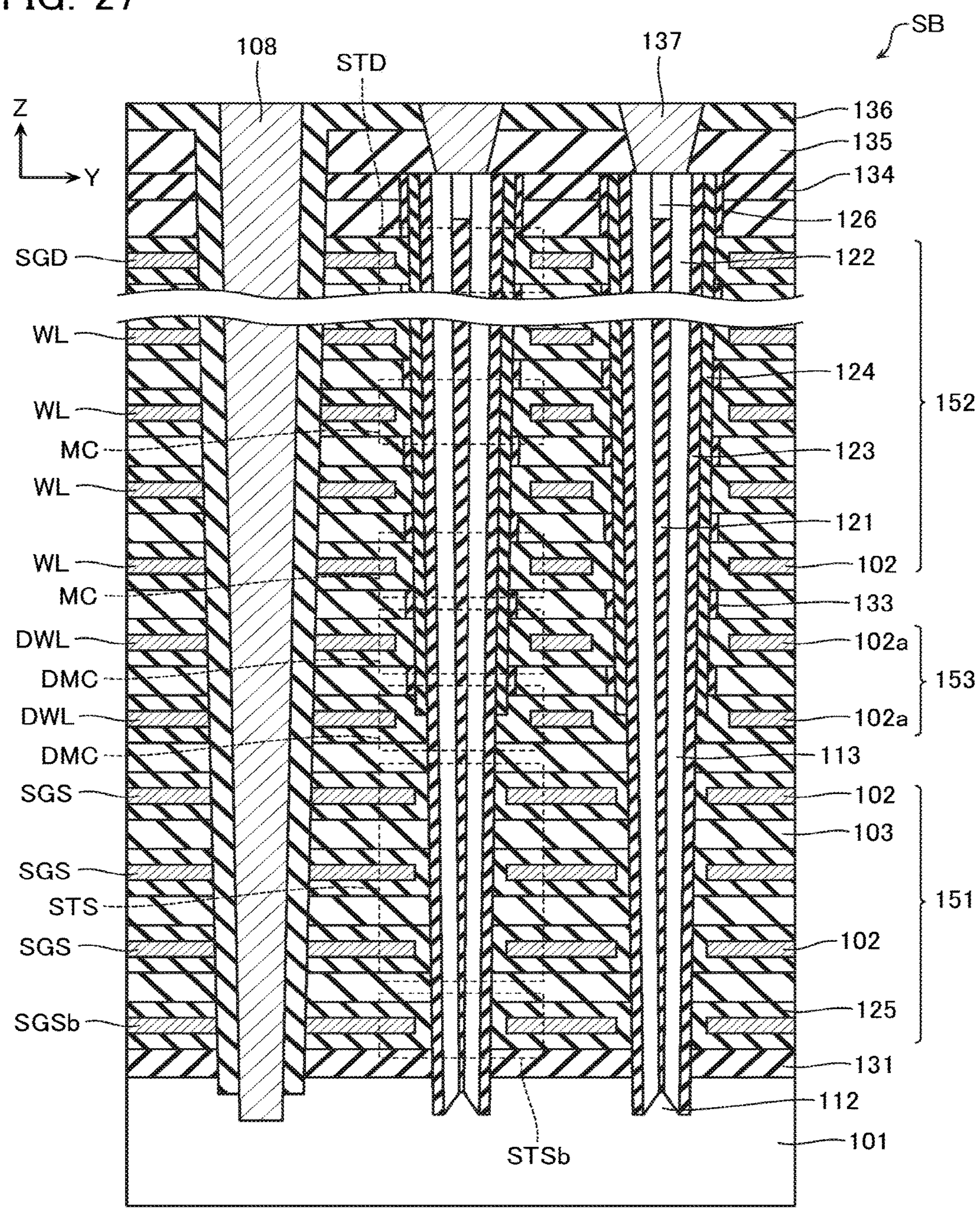
FIG. 27 is a cross-sectional view showing a configuration of part of a nonvolatile semiconductor memory device according to a fourth embodiment.

Next, a nonvolatile semiconductor memory device according to a fourth embodiment will be described with reference to FIG. 27. FIG. 27 is a cross-sectional view showing a configuration of part of the nonvolatile semiconductor memory device. Note that in the description below, portions similar to those of the first embodiment are assigned with reference symbols identical to those assigned in the first embodiment, and descriptions thereof will be omitted.

As shown in FIG. 27, the nonvolatile semiconductor memory device according to the present embodiment is basically configured similarly to the nonvolatile semiconductor memory device according to the first embodiment, but in the present embodiment, the stacked body SB includes, in addition to the first stacked portion 151 and second stacked portion 152, a third stacked portion 153 provided between these first stacked portion 151 and second stacked portion 152. The third stacked portion 153, similarly to the first stacked portion 151 and second stacked portion 152, includes: a plurality of the conductive layers 102 and inter-layer insulating layers 103; and the block insulating layer 125 covering the upper surface, lower surface, and side surface of the conductive layer 102. Moreover, the third stacked portion 153 functions as part of a dummy memory cell DMC.

In addition, as shown in FIG. 27, in the present embodiment also, similarly to in the first embodiment, the lower end of the charge accumulation layer 124 is positioned between the first stacked portion 151 and the second stacked portion 152. Therefore, for example, some of the dummy memory cells DMC include the charge accumulation layer 124, and some of the dummy memory cells DMC do not include the charge accumulation layer 124.

Now, as mentioned above, the memory cells MC each store a one-bit portion or a multiple-bit portion of data configuring the user data. In contrast, user data is not recorded in the dummy memory cell DMC. Therefore, the nonvolatile semiconductor memory device according to the present embodiment operates suitably, even if some of the dummy memory cells DMC do not include the charge accumulation layer 424.

Moreover, during the likes of a read operation, a conductive layer 102*a* functioning as a control gate electrode of the dummy memory cell DMC and as a dummy word line DWL is applied with a voltage. Therefore, a portion functioning as a channel of the dummy memory cell DMC, of the semiconductor layer 122 can be suitably rendered in a conductive state.

Fifth Embodiment

Figure 28:
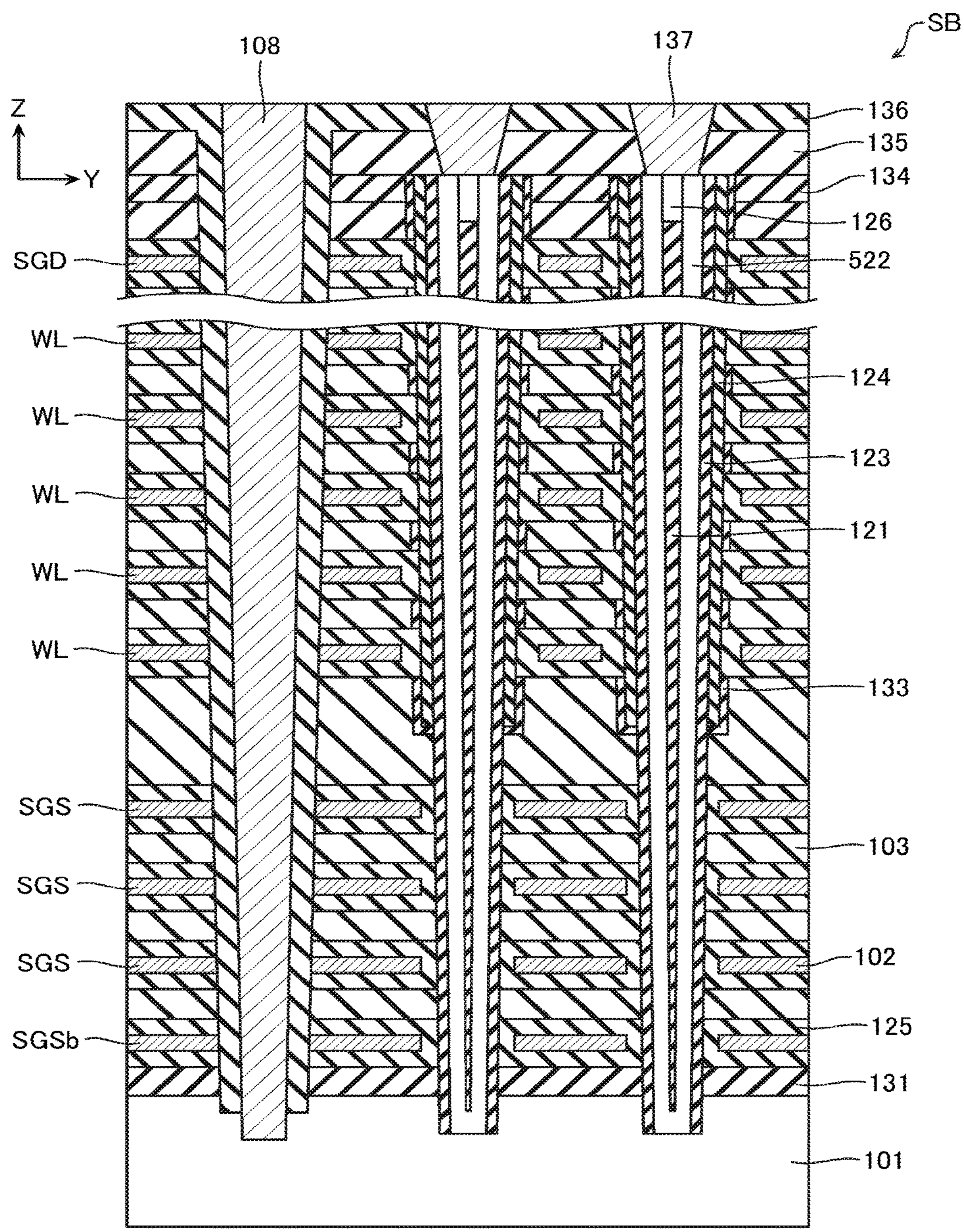
FIG. 28 is a cross-sectional view showing a configuration of part of a nonvolatile semiconductor memory device according to a fifth embodiment.

Next, a nonvolatile semiconductor memory device according to a fifth embodiment will be described with reference to FIG. 28. FIG. 28 is a cross-sectional view showing a configuration of part of the nonvolatile semiconductor memory device. Note that in the description below, portions similar to those of the first embodiment are assigned with reference symbols identical to those assigned in the first embodiment, and descriptions thereof will be omitted.

As shown in FIG. 28, the nonvolatile semiconductor memory device according to the present embodiment is basically configured similarly to the nonvolatile semiconductor memory device according to the first embodiment, but a configuration of a semiconductor layer 522 is different. The semiconductor layer 522 is basically formed similarly to the semiconductor layer 122 described with reference to FIG. 5, but differs in entirely having a polycrystalline structure.

Figure 29:
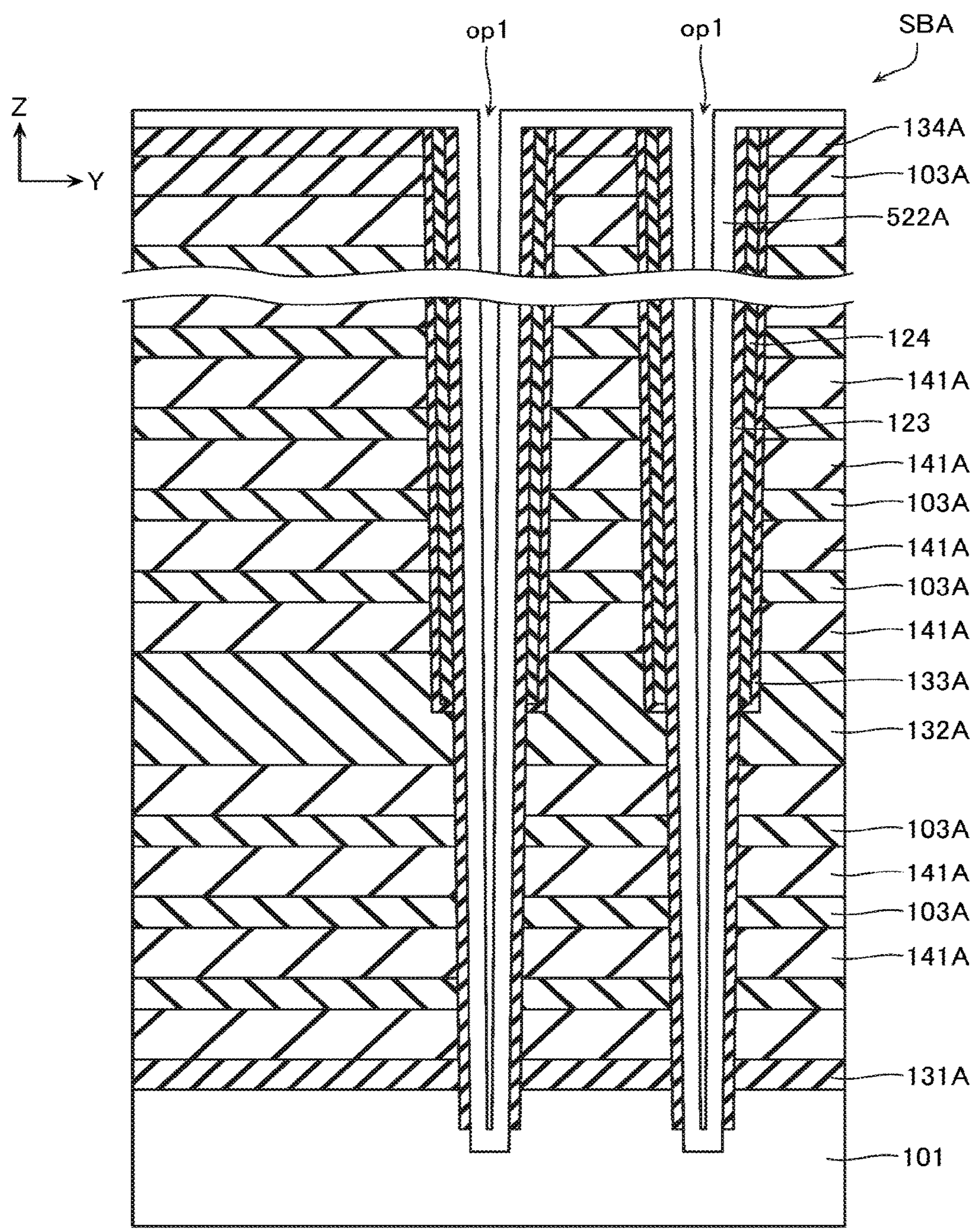
FIG. 29 is a cross-sectional view showing a method of manufacturing the nonvolatile semiconductor memory device.

Next, a method of manufacturing the nonvolatile semiconductor memory device according to the fifth embodiment will be described with reference to FIG. 29. FIG. 29 is a cross-sectional view showing the method of manufacturing.

The method of manufacturing according to the present embodiment is performed similarly to the method of manufacturing according to the first embodiment for steps from step S101 to step S105.

As shown in FIG. 29, in the method of manufacturing according to the present embodiment, in step S106, a semiconductor layer 522A forming the semiconductor layer 522 is formed on the upper surface of the stacked body SBA and on the inside of the opening op1. The semiconductor layer 522A is formed from the likes of amorphous-state silicon, for example. Subsequently, a step similar to the step described with reference to FIG. 14 is performed, whereby the semiconductor layer 522 is formed.

Subsequently, steps from step S107 onward, of the method of manufacturing according to the first embodiment are performed, whereby the nonvolatile semiconductor memory device according to the fifth embodiment is manufactured.

Sixth Embodiment

Figure 30:
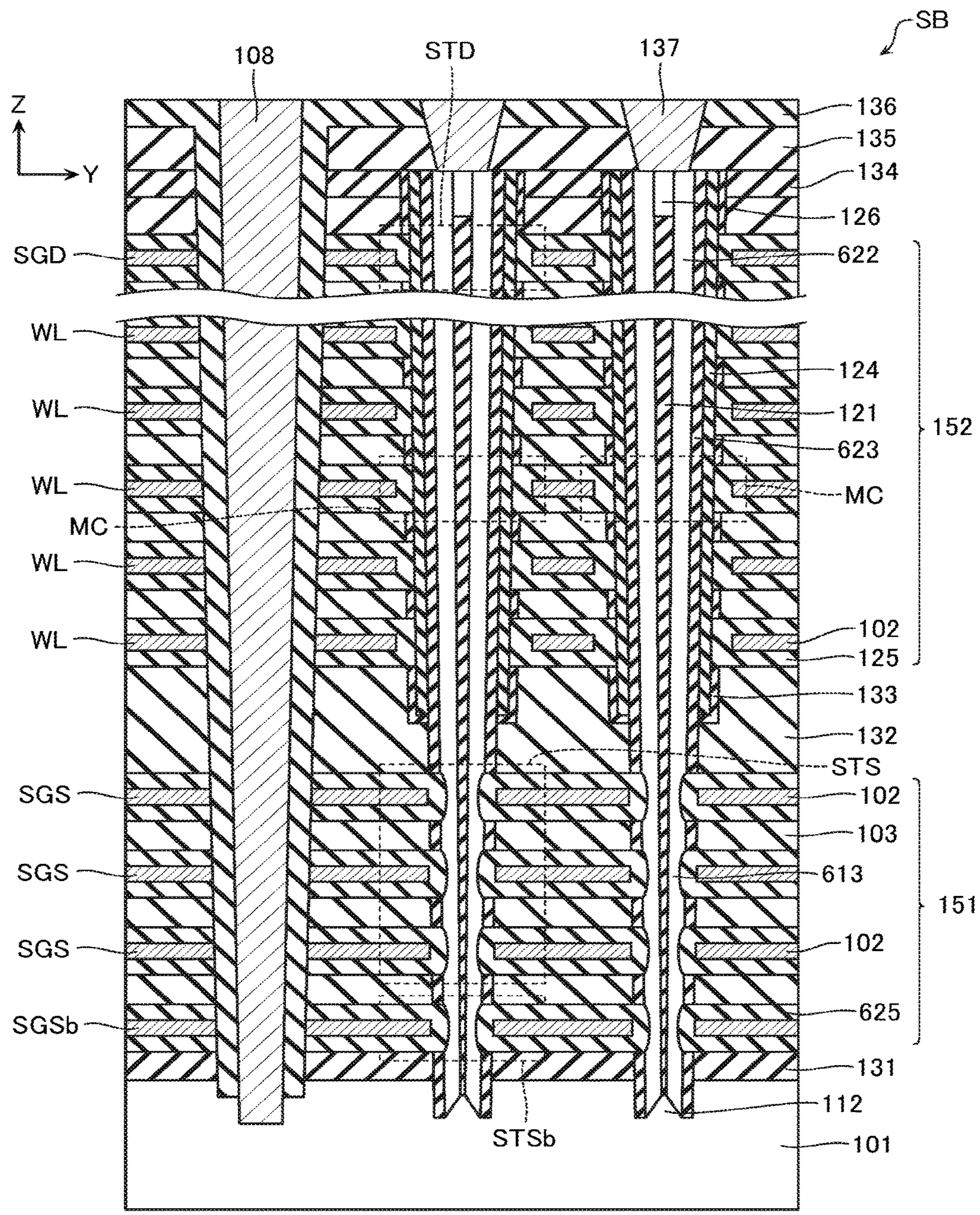
FIG. 30 is a cross-sectional view showing a configuration of part of a nonvolatile semiconductor memory device according to a sixth embodiment.

Next, a nonvolatile semiconductor memory device according to a sixth embodiment will be described with reference to FIG. 30. FIG. 30 is a cross-sectional view showing a configuration of part of the nonvolatile semiconductor memory device. Note that in the description below, portions similar to those of the first embodiment are assigned with reference symbols identical to those assigned in the first embodiment, and descriptions thereof will be omitted.

As shown in FIG. 30, the nonvolatile semiconductor memory device according to the present embodiment is basically configured similarly to the nonvolatile semiconductor memory device according to the first embodiment, but configurations of a semiconductor layer 622 and a tunnel insulating layer 623 are different.

That is, the semiconductor layer 622 according to the present embodiment is basically configured similarly to the semiconductor layer 122 described with reference to FIG. 5, but differs in having a recessed portion formed in part of its sidewall. Moreover, the recessed portion 613 of the semiconductor layer 622 contacts a block insulating layer 625 of the stacked body SB.

Now, as shown in FIG. 5, in the first embodiment, gate insulating films of the source side select gate transistor STS and the lowermost layer source side select gate transistor STSb were configured from a stacked film of the tunnel insulating layer 123 and the block insulating layer 125. In contrast, in the present embodiment, as shown in FIG. 30, the gate insulating films of the source side select gate transistor STS and the lowermost layer source side select gate transistor STSb are configured from the single-layer block insulating layer 625. Therefore, the control gate electrode and the channel of the source side select gate transistor STS or lowermost layer source side select gate transistor STSb can be brought close, whereby a threshold voltage for rendering these transistors in an ON state can be reduced.

Figure 31:
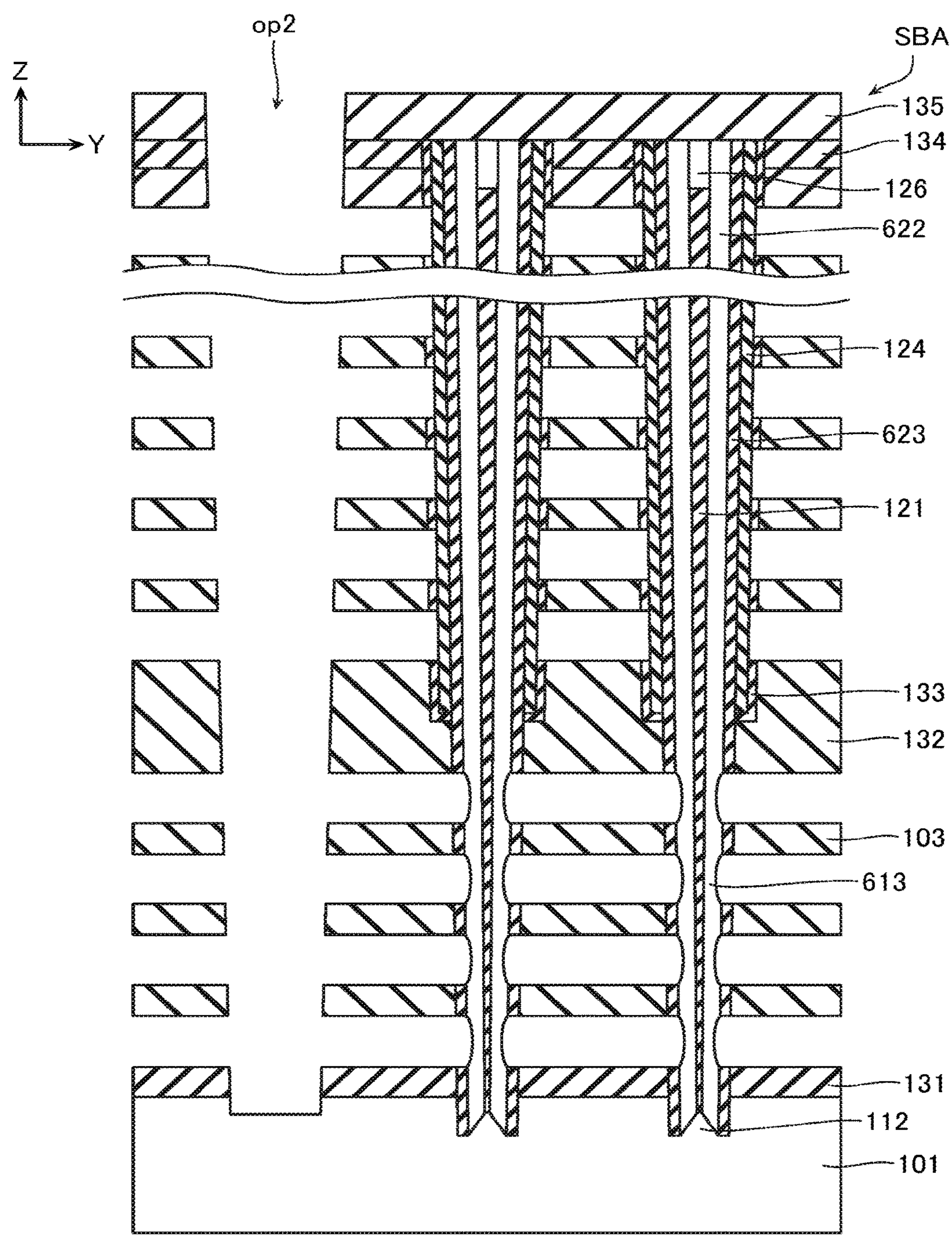
FIG. 31 is a cross-sectional view showing a method of manufacturing the nonvolatile semiconductor memory device.

Next, a method of manufacturing the nonvolatile semiconductor memory device according to the sixth embodiment will be described with reference to FIG. 31. FIG. 31 is a cross-sectional view showing the method of manufacturing.

The method of manufacturing according to the present embodiment is performed similarly to the method of manufacturing according to the first embodiment for steps from step S101 to step S107.

As shown in FIG. 31, in step S108 according to the present embodiment, similarly to in the first embodiment, the sacrifice layer 141A is removed via the trench op2. In addition, part of the insulating layer 133A is removed via the trench op2. Furthermore, in the present embodiment, not only the insulating layer 133A, but also a portion exposed in the trench op2 of the tunnel insulating layer 123, is removed. As a result, the portion exposed in the trench op2, of the tunnel insulating layer 123, is removed, and a side surface of the semiconductor layer 122 is exposed. Moreover, the side surface of the semiconductor layer 122 is partially removed and the semiconductor layer 622 having the recessed portion is formed.

Subsequently, steps from step S109 onward, of the method of manufacturing according to the first embodiment are performed, whereby the nonvolatile semiconductor memory device according to the sixth embodiment is manufactured.

Other Embodiments

In the first through sixth embodiments, the lower end of the charge accumulation layer was positioned between the first stacked portion 151 and the second stacked portion 152 of the stacked body SB. However, the lower end of the charge accumulation layer may be provided at a certain position between from a lower end of a lowermost layer-positioned one of the conductive layers 102 to a lower end of the first stacked portion 151, for example. Such a mode, similarly to the first through sixth embodiments, makes it possible to prevent a problem that the semiconductor layer operating as the channel of the memory cell MC, and so on, and the conductive layer 108 operating as the source contact LI get electrically divided, and by preventing this problem, enables the read operation to be suitably performed.

Figure 32:
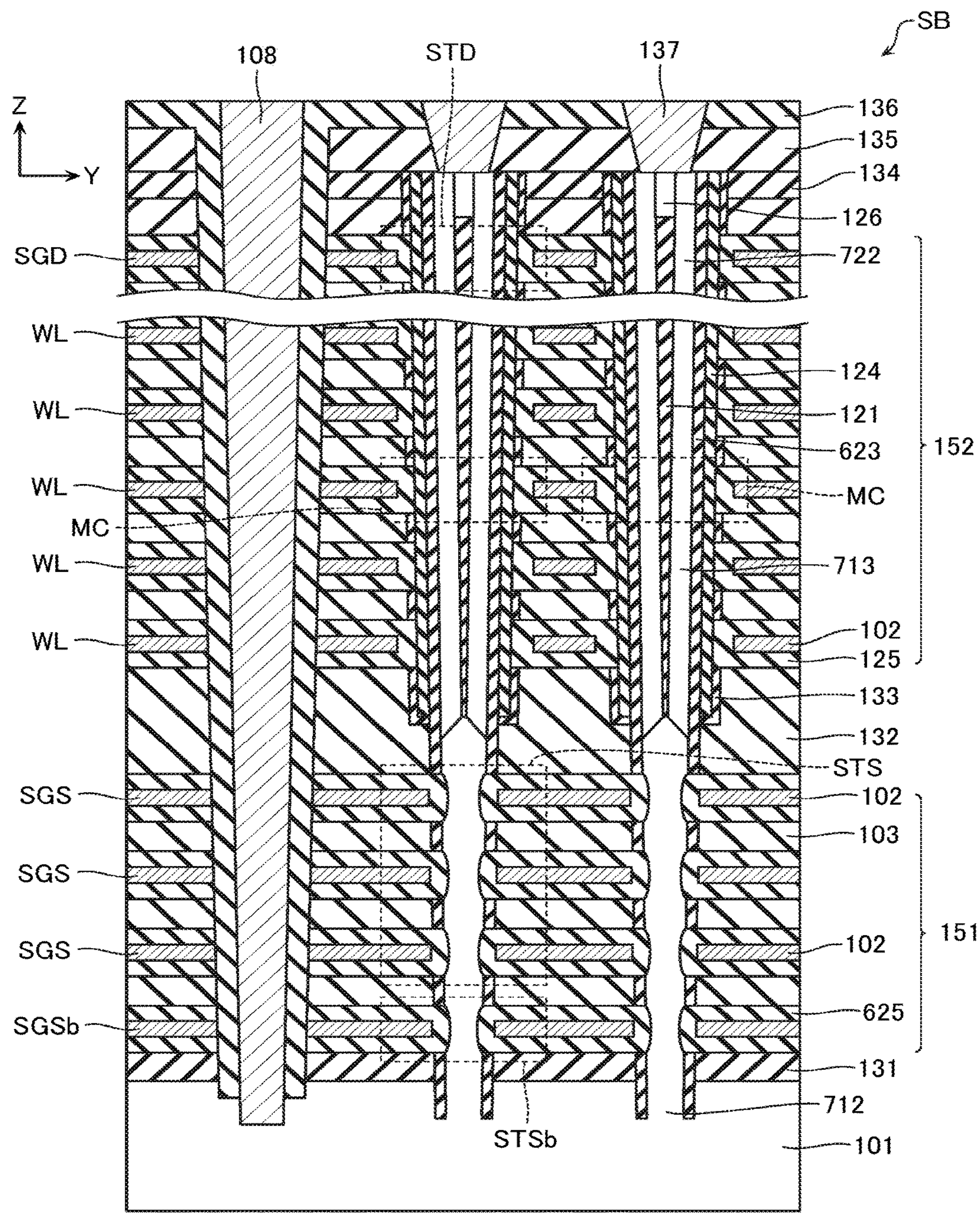
FIG. 32 is a cross-sectional view showing a configuration of part of a nonvolatile semiconductor memory device according to another embodiment.

In addition, matters described in the first through sixth embodiments may also be appropriately combined in a variety of modes. For example, as described with reference to FIG. 22, in the third embodiment, the first portion 312 having a monocrystalline structure of the semiconductor layer 322 had a columnar shape having the Z direction as its longer direction. Moreover, as described with reference to FIG. 30, in the sixth embodiment, part of the tunnel insulating layer 623 was removed and the block insulating layer 625 directly contacted the semiconductor layer 622. By combining such matters, for example, as shown in FIG. 32, a first portion 712 having a monocrystalline structure of a semiconductor layer 722 may be formed in a columnar shape having the Z direction as its longer direction, and this first portion 712 of the semiconductor layer 722 may be directly contacted by the block insulating layer 625.

Moreover, in the first embodiment, for example, as described with reference to FIG. 9, when the non-through hole was formed, this non-through hole op1 was configured such that part of the insulating layer 132A was removed and the insulating layer 132A was not penetrated. However, it is also possible for a layer having a different etching rate to those of the insulating layer 103A and sacrifice layer 141A to be inserted instead of the insulating layer 132A, and for this layer to be adopted as an etching stopper, for example.

In addition, the nonvolatile semiconductor memory devices according to the first through sixth embodiments included the source side select gate transistor STS and the lowermost layer source side select gate transistor STSb. However, it is also possible for one of these to be omitted, for example.

Moreover, the source side select gate transistor STS according to the first through sixth embodiments included a plurality of the conductive layers 102 as its control gate. However, a single-layer conductive layer 102 may be used as the source side select gate line SGS and control gate of the source side select gate transistor STS.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:

a plurality of control gate electrodes provided as a stack above a substrate;

a semiconductor layer having as its longitudinal direction a direction perpendicular to the substrate, the semiconductor layer facing the plurality of control gate electrodes; and a charge accumulation layer positioned between the plurality of control gate electrodes and the semiconductor layer, a lower end of the charge accumulation layer being positioned more upwardly than a lower end of a lowermost layer-positioned one of the plurality of control gate electrodes, wherein the plurality of control gate electrodes include:

a first control gate electrode; and a plurality of second control gate electrodes positioned more upwardly than the first control gate electrode, and the lower end of the charge accumulation layer is positioned between the first control gate electrode and the plurality of second control gate electrodes, the semiconductor memory device further comprising:

a memory string including a plurality of memory cells connected in series; and a select gate transistor connected to one end of the memory string, wherein the first control gate electrode functions as a control gate electrode of the select gate transistor, and each of the plurality of second control gate electrodes functions as a control gate electrode of the memory cell, wherein the semiconductor layer is provided integrally in a range from a portion configuring the select gate transistor to a portion configuring the memory cell.

2. A semiconductor memory device, comprising:

a plurality of control gate electrodes provided as a stack above a substrate;

a semiconductor layer having as its longitudinal direction a direction perpendicular to the substrate, the semiconductor layer facing the plurality of control gate electrodes; and a charge accumulation layer positioned between the plurality of control gate electrodes and the semiconductor layer, a lower end of the charge accumulation layer being positioned more upwardly than a lower end of a lowermost layer-positioned one of the plurality of control gate electrodes, wherein the plurality of control gate electrodes include:

a first control gate electrode; and a plurality of second control gate electrodes positioned more upwardly than the first control gate electrode, and the lower end of the charge accumulation layer is positioned between the first control gate electrode and the plurality of second control gate electrodes, the semiconductor memory device further comprising:

a memory string including a plurality of memory cells connected in series; and a select gate transistor connected to one end of the memory string, wherein the first control gate electrode functions as a control gate electrode of the select gate transistor, and each of the plurality of second control gate electrodes functions as a control gate electrode of the memory cell, wherein a sidewall of the semiconductor layer is formed continuously in a range from a portion configuring the select gate transistor to a portion configuring the memory cell.

3. The semiconductor memory device according to claim 1, wherein a spacing between the first control gate electrode and the plurality of second control gate electrodes is larger than a spacing in a stacking direction of the plurality of second control gate electrodes.

4. The semiconductor memory device according to claim 1, further comprising:

a dummy memory cell provided between the plurality of memory cells and the select gate transistor, wherein the plurality of control gate electrodes further include a third control gate electrode positioned between the first control gate electrode and the plurality of second control gate electrodes, and the third control gate electrode functions as a control gate electrode of the dummy memory cell.

5. The semiconductor memory device according to claim 1, wherein the semiconductor layer comprises:

a first portion formed integrally with the substrate; and a second portion having as its longitudinal direction the direction perpendicular to the substrate, the second portion being connected to the first portion at a lower end of the second portion.

6. The semiconductor memory device according to claim 5, wherein the first portion of the semiconductor layer has a monocrystalline structure, and the second portion of the semiconductor layer has a polycrystalline structure.

7. The semiconductor memory device according to claim 5, wherein the first portion of the semiconductor layer has as its longitudinal direction the direction perpendicular to the substrate, and faces the plurality of the control gate electrodes.

8. The semiconductor memory device according to claim 2, wherein a spacing between the first control gate electrode and the plurality of second control gate electrodes is larger than a spacing in a stacking direction of the plurality of second control gate electrodes.

9. The semiconductor memory device according to claim 2, further comprising:

a dummy memory cell provided between the plurality of memory cells and the select gate transistor, wherein the plurality of control gate electrodes further include a third control gate electrode positioned between the first control gate electrode and the plurality of second control gate electrodes, and the third control gate electrode functions as a control gate electrode of the dummy memory cell.

10. The semiconductor memory device according to claim 2, wherein the semiconductor layer comprises:

a first portion formed integrally with the substrate; and a second portion having as its longitudinal direction the direction perpendicular to the substrate, the second portion being connected to the first portion at a lower end of the second portion.

11. The semiconductor memory device according to claim 10, wherein the first portion of the semiconductor layer has a monocrystalline structure, and the second portion of the semiconductor layer has a polycrystalline structure.

12. The semiconductor memory device according to claim 10, wherein the first portion of the semiconductor layer has as its longitudinal direction the direction perpendicular to the substrate, and faces the plurality of the control gate electrodes.

* * * * *